US009934943B2

(12) United States Patent
Kuiper et al.

(10) Patent No.: US 9,934,943 B2
(45) Date of Patent: Apr. 3, 2018

(54) BEAM GRID LAYOUT

(71) Applicant: MAPPER LITHOGRAPHY IP B.V., Delft (NL)

(72) Inventors: Vincent Sylvester Kuiper, The Hague (NL); Erwin Slot, Zoetermeer (NL)

(73) Assignee: MAPPER LITHOGRAPHY IP B.V., Delft (NL)

( * ) Notice: Subject to any disclaimer, the term of this patent is extended or adjusted under 35 U.S.C. 154(b) by 76 days.

(21) Appl. No.: 14/787,775

(22) PCT Filed: May 5, 2014

(86) PCT No.: PCT/EP2014/059106
§ 371 (c)(1),
(2) Date: Oct. 29, 2015

(87) PCT Pub. No.: WO2014/177718
PCT Pub. Date: Nov. 6, 2014

(65) Prior Publication Data
US 2016/0071696 A1    Mar. 10, 2016

Related U.S. Application Data

(60) Provisional application No. 61/818,919, filed on May 3, 2013.

(51) Int. Cl.
*H01J 37/317*    (2006.01)
*H01J 37/09*     (2006.01)
*H01J 37/30*     (2006.01)

(52) U.S. Cl.
CPC ......... *H01J 37/3177* (2013.01); *H01J 37/09* (2013.01); *H01J 37/3007* (2013.01);
(Continued)

(58) Field of Classification Search
USPC .................................................... 250/492.22
See application file for complete search history.

(56) References Cited

U.S. PATENT DOCUMENTS 5,369,282 A    11/1994 Arai et al.
6,897,458 B2   5/2005  Wieland et al.
(Continued)

FOREIGN PATENT DOCUMENTS

EP         0135366 A1   3/1985
WO    WO 2007 013802 A1   2/2007
(Continued)

*Primary Examiner* — Kiet T Nguyen
(74) *Attorney, Agent, or Firm* — Hoyng Rock Monegier LLP; David P. Owen

(57) ABSTRACT

A sub-beam aperture array for forming a plurality of sub-beams from one or more charged particle beams. The sub-beam aperture array comprises one or more beam areas, each beam area comprising a plurality of sub-beam apertures arranged in a non-regular hexagonal pattern, the sub-beam apertures arranged so that, when projected in a first direction onto a line parallel to a second direction, the sub-beam apertures are uniformly spaced along the line, and wherein the first direction is different from the second direction. The system further comprises a beamlet aperture array with a plurality of beamlet apertures arranged in one or more groups. The beamlet aperture array is arranged to receive the sub-beams and form a plurality of beamlets at the locations of the beamlet apertures of the beamlet array.

33 Claims, 13 Drawing Sheets

(52) U.S. Cl.
CPC .......... *H01J 2237/0435* (2013.01); *H01J 2237/0453* (2013.01); *H01J 2237/3175* (2013.01); *H01J 2237/31774* (2013.01)

(56) References Cited

U.S. PATENT DOCUMENTS

| | | |
|---|---|---|
| 6,958,804 B2 | 10/2005 | Wieland et al. |
| 7,019,908 B2 | 3/2006 | Van T Spijker et al. |
| 7,084,414 B2 | 8/2006 | Wieland et al. |
| 7,129,502 B2 | 10/2006 | Kruit |
| 7,391,033 B1 | 6/2008 | Adler |
| 7,709,815 B2 | 5/2010 | Jager et al. |
| 7,842,936 B2 | 11/2010 | Kruit et al. |
| 2005/0242302 A1 | 11/2005 | Platzgummer et al. |
| 2005/0242303 A1 | 11/2005 | Platzgummer et al. |
| 2011/0073782 A1 | 3/2011 | Wieland et al. |
| 2012/0091318 A1 | 4/2012 | Wieland et al. |
| 2013/0187046 A1* | 7/2013 | Zeidler .......... B82Y 10/00 250/310 |
| 2015/0311031 A1* | 10/2015 | Platzgummer ........ H01J 37/147 250/396 R |

FOREIGN PATENT DOCUMENTS

| | | |
|---|---|---|
| WO | WO 2007 048433 A1 | 5/2007 |
| WO | WO 2009 147202 A1 | 12/2009 |

* cited by examiner

BEAM GRID LAYOUT

CROSS REFERENCE TO RELATED APPLICATION

This application is a 35 U.S.C. 371 National Phase Entry Application from PCT/EP2014/059106, filed May 05, 2014, which claims the benefit of US Provisional Patent Application No. 61/818,919, filed on May 03, 2013, the disclosure of which is incorporated herein in its entirety by reference.

BACKGROUND OF THE INVENTION

1. Field of the Invention

The present invention relates to an aperture array and a charged particle lithography system using an aperture array.

2. Description of the Related Art

In the charged particle lithography field, various aperture pattern schemes for a multi-beam pattern definition device are known. For example, U.S. Pat. No. 5,369,282 to Arai discloses an electron-beam lithography system using a blanking aperture array (BAA) as the pattern definition device. The BAA has a number of rows of apertures, and the images of the apertures are scanned over a stripe of the substrate in a controlled, continuous motion.

Arai teaches to group aperture rows of the BAA by exposure order. The substrate stripe is first exposed using a full dosage, as delivered by a first group, and then subsequently exposed to compensate for proximity effects exhibited by the substrate stripe, as delivered by a second group. In some embodiments, corresponding apertures of the first and second groups are offset from each other in relation to an electron scanning direction and/or to a mechanical scanning direction. Further, within each group, apertures on every other row align in the electron-scan direction and all rows align in the mechanical-scan direction.

U.S. Patent Application No. 2011-0073782 to Wieland discloses an electron-beam lithography system with a beamlet blanker array with apertures for generating 16 sub-beams arranged in a square 4×4 array, where each sub-beam is divided into 9 beamlets arranged in a square 3×3 array. Wieland teaches various writing strategies using such beamlet arrangements to achieve exposure of a wafer surface when the wafer is moved with respect to the beamlet blanker array and the beamlets are deflected over the surface of the wafer.

Among other deficiencies, the system of Arai lacks sufficient throughput for commercial viability and neither system provides an optimum arrangement of sub-beams or beamlets for uniform exposure of the wafer. Thus there is a need for alternative aperture pattern schemes that improve throughput and distribution of the writing beams on the wafer surface.

BRIEF SUMMARY OF THE INVENTION

The invention aims to address these problems. In one aspect the invention provides a sub-beam aperture array for forming a plurality of sub-beams from one or more charged particle beams. The sub-beam aperture array comprises one or more beam areas, each beam area comprising a plurality of sub-beam apertures arranged in a non-regular hexagonal pattern, the sub-beam apertures arranged so that, when projected in a first direction onto a line parallel to a second direction, the sub-beam apertures are uniformly spaced along the line, and wherein the first direction is different from the second direction.

In the non-regular hexagonal pattern of the sub-beam apertures of each beam area, each aperture has six neighbouring apertures, but these six neighbours are not arranged in the shape of a regular hexagon. The hexagonal pattern is non-regular in the sense that an aperture is not equi-distant from all of its six neighbouring apertures, but the aperture array preferably repeats the same non-regular hexagonal pattern uniformly within each beam area so that every aperture within a beam area is arranged in the same non-regular hexagonal pattern. The uniform spacing of sub-beam apertures when they are projected onto a line parallel to the second direction, results in evenly spaced writing paths when a plurality of sub-beams are formed using the sub-beam aperture array, and a target such as a wafer is moved perpendicular to the second direction relative to the sub-beam aperture array. The uniform spacing of projected apertures preferably applies for all of the sub-beam apertures in all of the beam areas. The preferred arrangement enables each sub-beam to form a separate writing path which does not coincide with the writing path of any other sub-beam and is equidistant from the writing paths of adjacent sub-beams.

Within each of the one or more beam areas of the sub-beam aperture array, the sub-beam apertures may be arranged in a plurality of columns regularly spaced in the second direction, with the sub-beam apertures in each column offset by a same amount, in the second direction, from each adjacent sub-beam aperture in the same column. Furthermore, the columns of sub-beam apertures may extend generally in the first direction, the columns being spaced apart with uniform spacing in the second direction. Within each column, adjacent apertures may be offset from each other in the second direction by a uniform offset. This uniform offset results in the sub-beam apertures being uniformly spaced, when projected in the first direction onto a line parallel to the second direction. This offset also results in the columns of apertures not extending exactly in the first direction but at a slight angle to the first direction.

The offset between sub-beam apertures within each column may be the same as an offset between a sub-beam aperture in one beam area and an adjacent sub-beam aperture in a corresponding column of another beam area. The offset of adjacent sub-beam apertures in a single column may be equal to a fraction of a diameter of the sub-beam apertures. Also, within each of the one or more beam areas, the sub-beam apertures in each column may be staggered, in the first direction, with respect to the sub-beam apertures of a neighbouring column. This stagger of apertures of adjacent columns results in the apertures being not aligned in the second direction. In one arrangement, the sub-beam apertures of neighbouring columns are not aligned in the second direction but the sub-beam apertures of every other column are be aligned in the second direction.

In the sub-beam aperture array, the second direction may be substantially perpendicular to the first direction. The first and second directions may be exactly perpendicular, but also may be close to perpendicular but not exactly perpendicular. This may be done, for example, to compensate for movement of the target in the first direction while the sub-beams are being scanned across the surface of the target in the second direction.

In a second aspect the invention provides a beamlet aperture array for forming a plurality of beamlets from one or more charged particle sub-beams. The beamlet aperture array comprises a plurality of beamlet apertures arranged in one or more groups, wherein the beamlet apertures are arranged so that, when projected in a fourth direction onto a line parallel to a third direction, the sub-beam apertures of each group are uniformly spaced along the line, and wherein the third direction is different from the fourth direction. The beamlets may be formed from a single charged particle sub-beam, or from multiple separate sub-beams, where each group of beamlet apertures corresponds with a separate charged particle sub-beam projected onto the beamlet aperture array. The sub-beams may be formed by a separate sub-beam array as described above and herein.

The uniform spacing of beamlet apertures when they are projected onto a line parallel to the third direction, results in evenly spaced writing paths when a plurality of beamlets are formed using the beamlet aperture array, and the beamlets are scanned across a target such as a wafer perpendicular to the third direction. The uniform spacing of projected apertures preferably applies for all of the beamlet apertures in each group. The preferred arrangement enables each beamlet to form a separate writing path which does not coincide with the writing path of any other beamlet and is equidistant from the writing paths of adjacent beamlets.

The beamlet apertures may be arranged in rows and columns, each beamlet aperture within a row of the beamlet aperture array being uniformly offset in the third direction from adjacent beamlet apertures in the row. In the beamlet aperture array, the fourth direction may be substantially perpendicular to the third direction. The third and fourth directions may be exactly perpendicular, but also may be close to perpendicular but not exactly perpendicular. This may be done, for example, to compensate for movement of the target in the third direction while the sub-beams are being scanned across the surface of the target in the fourth direction. The beamlet aperture apertures within a column of each group may be aligned in the fourth direction.

In another aspect the invention provides a beamlet aperture array for forming a plurality of beamlets from one or more charged particle sub-beams, the beamlet aperture array comprising a plurality of beamlet apertures arranged in one or more groups, each group corresponding to a sub-beam, wherein the positions of the beamlet apertures within each group form an unbalanced array.

The beamlet apertures neighboring within a row of the beamlet aperture array may be offset from each other by a uniform amount with respect to the third direction. The offset may be equal to a fraction of the pitch between the neighboring beamlet apertures. This fraction may be equal to the pitch between the neighboring beamlet apertures divided by the number of beamlet apertures within the row. The beamlet apertures in each group of the beamlet aperture array may be arranged in the form of a skewed square array.

The beamlet apertures in each group may be all offset from the center of a beam spot formed by the group of beamlet apertures. In a beamlet aperture array with forty-nine beamlet apertures arranged within the beam spot, each beamlet aperture may be associated with an aperture number, and the offset in an X direction of each beamlet aperture from the center of the beam spot is defined by the formula: appxoffset=(int[(aperture number−1)/7)]−3)* pitch, where int is a floor function. The offset in a Y direction of each beamlet aperture from the center of the beam spot may be defined by the formula: appyoffset=(−pitch/2)+[(6−[(aperture number−1) mod 7]+int(aperture number/29)−3) *pitch]−[(pitch/7)* (int[(aperture number−1)/7)]−3)], where int is a floor function.

In yet another aspect, the invention provides a charged particle lithography system for exposing a target using a plurality of charged particle sub-beams. The system comprises a charged particle generator for generating a charged particle beam, a sub-beam aperture array as described above and herein arranged to receive the charged particle beam and form a plurality of sub-beams at the locations of the apertures of the sub-beam array, and a projection lens system configured to project the sub-beams onto the surface of the target.

The charged particle lithography system may further comprise a deflector arranged to deflect the sub-beams in the first direction, and may further comprise a moveable stage for moving the target in the second direction. The first direction may correspond to a scanning direction of the plurality of sub-beams and the second direction to a mechanical-scan direction of the target.

The charged particle lithography system may also comprise a beamlet aperture array as described above and herein, the beamlet aperture array arranged to receive the sub-beams and form a plurality of beamlets at the locations of the beamlet apertures of the beamlet array. The first direction (for the sub-beam array) may be the same as the third direction (for the beamlet array), and the second direction (for the sub-beam array) may be the same as the fourth direction (for the beamlet array).

In yet another aspect, the invention provides a method for exposing a field of a target using a plurality of charged particle beamlets, the field having a length in a first direction and a width in a second direction. The method comprises forming the charged particle beamlets into a plurality of discrete groups, the groups being equally spaced across the width of the field, and moving the target in the first direction and simultaneously scanning each group of beamlets across a width of a corresponding stripe of the field so that each beamlet follows a writing path on the surface of the target, wherein the writing paths of the beamlets of each group are evenly spaced in the first direction. Each group of beamlets is assigned to a single stripe of the field, and is deflected across the width of the field as the target is moved. The writing paths of separate groups of beamlets do not substantially overlap (there may be some small overlap of the writing paths where stitching is performed at the boundary between two stripes). Similarly, the writing paths of the individual beamlets with each group are evenly spaced in the first direction.

The first direction may be substantially perpendicular to the second direction. The first and second directions may be exactly perpendicular, but also may be close to perpendicular but not exactly perpendicular. This may be done, for example, to compensate for movement of the target in the first direction while the beamlets are being scanned across the field.

BRIEF DESCRIPTION OF THE DRAWINGS

Various aspects of the invention will be further explained with reference to embodiments shown in the drawings wherein.

DESCRIPTION OF ILLUSTRATIVE EMBODIMENTS

The following is a description of various embodiments of the invention, given by way of example only and with reference to the drawings. Further, unless noted otherwise, the drawings are not drawn to scale.

In this description the following definitions are used:

Unbalanced array: an array or matrix with at least one row and/or column that has a different number of elements than another row or column of the array or matrix; a sub-set of unbalanced arrays include arrays with "shifted" columns, wherein the patterning scheme shifts one or more columns in relation to the other columns of the array.

Offset: the distance between one feature of an aperture, beam spot, or other object with respect to a corresponding feature of another object or other reference point. The distance may be with respect to (e.g. perpendicular to) a mechanical scan direction and/or an electron scan direction. For example, features of an aperture include the midpoint and centerline of an aperture.

Stagger: objects arranged in a zig-zag or other misalignment pattern.

Column: a sub-group of elements that align with the least deviation from the Y-axis or mechanical scan direction compared with alternative alignments of the elements of a group.

Row: a sub-group of elements that align with the least deviation from the X-axis or an electron scan direction compared with alternative alignments of the elements of a group.

Corresponding beam: A beam or group of beams arranged to pass through an aperture, projection lens, or deflector. Corresponding beams may have a one-to-one, one-to-many, or many-to-one relationship with an aperture, projection lens, or deflector.

Sub-beam: a charged particle beam projected by an aperture array that will be further divided into a plurality of beams known as beamlets.

Figure 1:
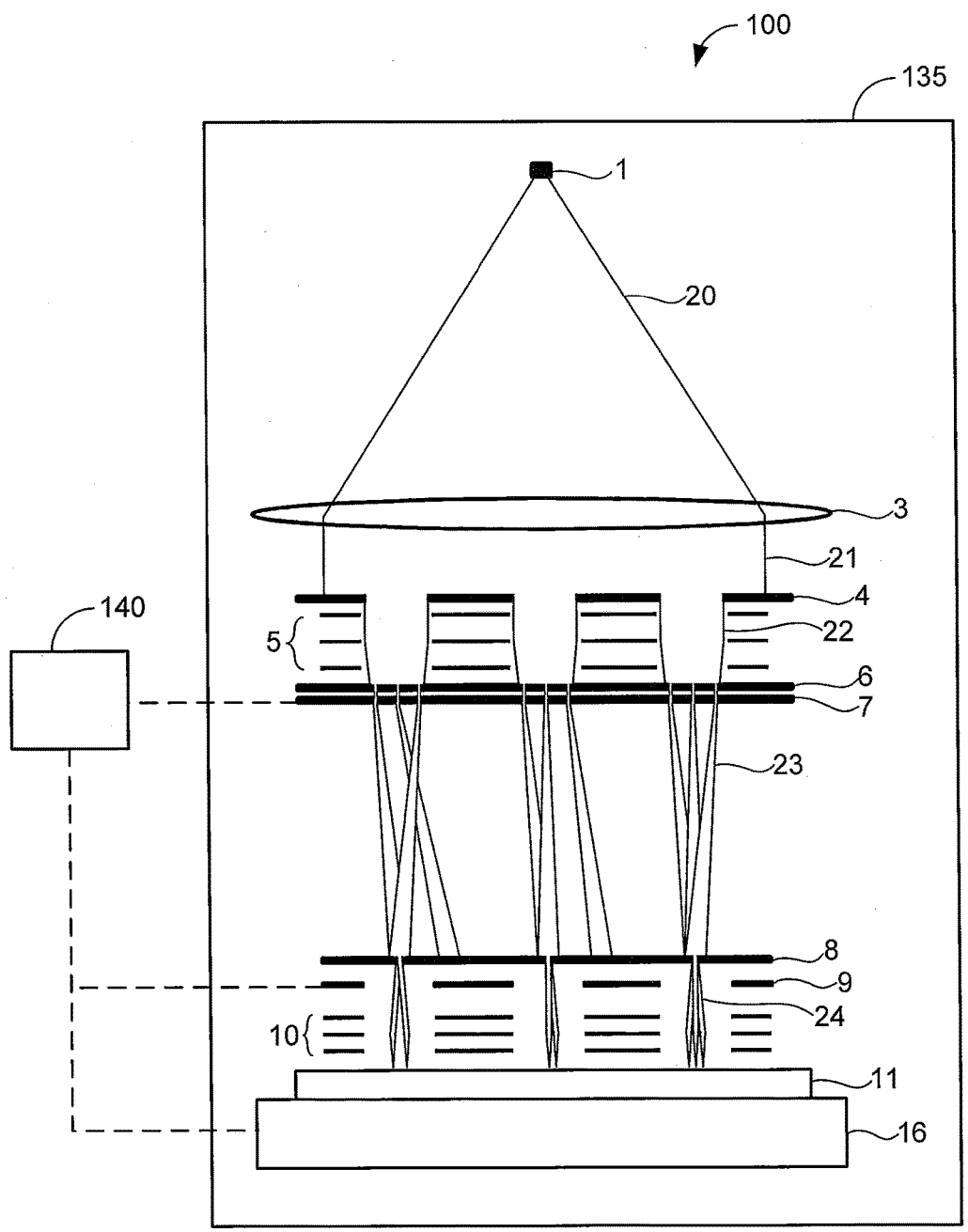
FIG. 1 is a simplified schematic overview of an example of a charged particle multi beamlet lithography system.

FIG. 1 shows a simplified schematic drawing of an embodiment of a charged particle multi-beamlet lithography system based upon an electron beam optical system without a common cross-over of all the electron beamlets. Such lithography systems are described for example in U.S. Pat. Nos. 6,897,458; 6,958,804; 7,019,908; 7,084,414; 7,129, 502; 7,709,815; and 7,842,936, which are all assigned to the owner of the present invention and are all hereby incorporated by reference in their entirety.

FIG. 1 further illustrates an embodiment of a charged particle multi-beamlet lithography system that forms beamlets from sub-beams. An electron source 1 produces a homogeneous, expanding electron beam 20. Beam energy is preferably maintained relatively low in the range of about 1 to 10 keV.

The electron beam 20 from the electron source 1 passes a collimator lens 3 to produce a collimated electron beam 21, which impinges on sub-beam aperture array 4. The aperture array 4 blocks part of the beam and emits a plurality of sub-beams 22. The system generates a large number of sub-beams 22, e.g. about 10,000 to 1,000,000 beamlets.

The sub-beams pass through a condenser lens array 5, which focuses the sub-beams approximately in the plane of beam stop array 8 and towards a corresponding opening in beam stop array 8. In principle each sub-beam can be focused either at the corresponding opening in beam stop array 8, or at the effective lens plane of the corresponding projection lens system. In practice it is preferred to focus the sub-beams somewhere between these two points. This results in the aperture array 4 being imaged onto the target 11.

The condenser lens array may comprise a single condenser lens array or a set of condenser lens arrays, as would be known to a person of skill in the field of electron-optics.

The sub-beams 22 are intercepted by multiple aperture array 6 which includes a number of apertures in the path of (i.e., corresponding to) each sub-beam, producing a group of beamlets 23 from each sub-beam 22. The groups of beamlets, formed from the sub-beams, are also focused approximately in the plane of beam stop array 8 and each group of beamlets is directed towards a corresponding opening in beam stop array 8.

These beamlets 23 then pass through beamlet blanker array 7. Blanked beamlets are blocked by beam stop array 8, while unblanked beamlets in each group pass through a corresponding opening in beam stop array 8 and are subsequently projected onto the target by projection lens arrangement 10. In the example shown in FIG. 1, the aperture array 6 produces a group of three beamlets 23 from each sub-beam 22. The group of beamlets, if undeflected by beam blanker array 7, strike the beam stop array 8 at a corresponding opening so that the three beamlets are projected onto the target by the projection lens system 10. In practice, a much larger number of beamlets may be produced for each projection lens system 10. In a practical embodiment, as many as 50 beamlets may be directed through a single projection lens system, and this may be increased to 200 or more.

The beamlet blanker array 7 may deflect individual beamlets 23 in a group of beamlets at certain times in order to blank them. This is illustrated in FIG. 1 by the left-hand sub-beam 22, in which the middle beamlet 23 has been deflected to a location on the beam stop array 8 near to but not at an opening so that the beamlet is blanked. In the middle sub-beam 22 the right-hand beamlet 23 has been deflected and is blanked, and in the right-hand sub-beam 22 no beamlets are deflected and blanked.

Subsequently, the electron beamlets 23 enter the end module. The end module may be constructed as an insertable, replaceable unit which comprises various components or a discreet combination of individual components. The end module includes a beam stop array 8, a beam deflector array 9, and a projection lens arrangement 10. The end module will, amongst other functions, provide a demagnification of about 25 to 500 times. Additionally, the end module may be configured to deflect the beamlets 23. After leaving the end module, the beamlets 23 impinge on a surface of a target 11 positioned at a target plane. For lithography applications, the target usually comprises a wafer provided with a charged-particle sensitive layer or resist layer.

In the end module, the electron beamlets 23 first pass beam stop array 8. This beam stop array 8 largely determines the opening angle of the beamlets. In an embodiment, the apertures in beam stop array 8 are round, resulting in beamlets with a generally uniform opening angle.

The passages of the beam stop array 8 may be aligned with the elements of the beamlet blanker array 7. The beamlet blanker array 7 and beam stop array 8 then operate together to block or let pass the beamlets 23 in the following way. If beamlet blanker array 7 deflects a beamlet, it will not pass through the corresponding aperture in beam stop array 8. Instead, it will be blocked by the substrate of beam stop array 8. However, if beamlet blanker array 7 does not deflect a beamlet, it will pass through the corresponding aperture in beam stop array 8, and will then be projected as a spot on the surface of target 11. In this way the individual beamlets 23 may be effectively switched on and off.

Next, the beamlets 23 pass through a beam deflector array 9 which provides for deflection of each beamlet 23 in a direction substantially perpendicular to the direction of the undeflected beamlets 23. Next, the beamlets 23 pass through projection lens arrangement 10 and are projected onto a target 11 to be exposed, typically a wafer, located in a target plane.

Figure 2:
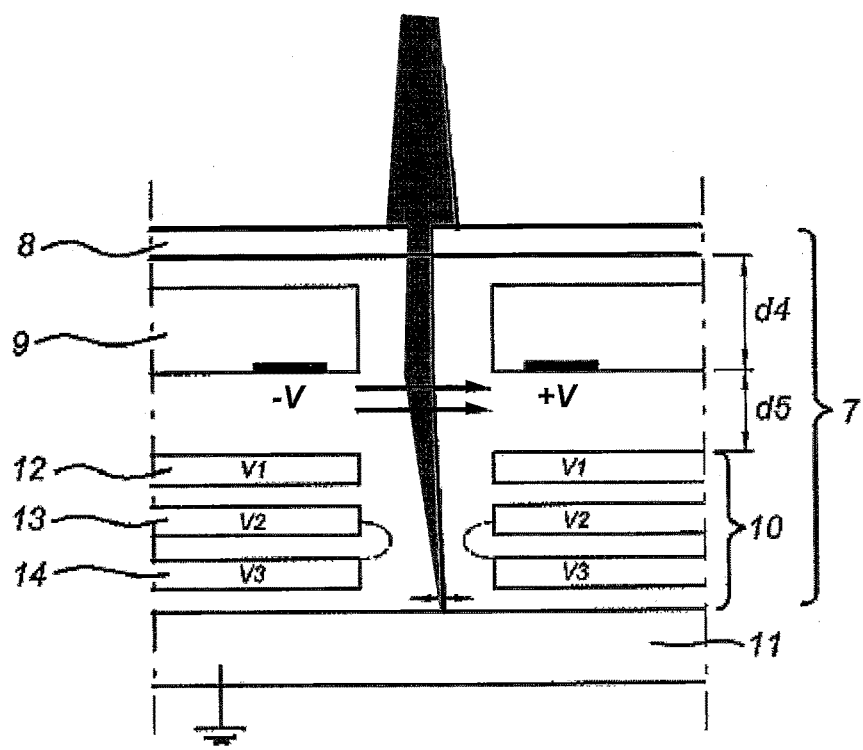
FIG. 2 is a simplified schematic overview, in side view, of an end module of the lithography system of FIG. 1.

FIG. 2 shows an embodiment of the end module in more detail, showing the beam stop array 8, the deflection array 9, and the projection lens arrangement 10, projecting an electron beamlet onto a target 11. The beamlets 23 are projected onto target 11, preferably resulting in a geometric spot size of about 10 to 30 nanometers in diameter. The projection lens arrangement 10 in such a design may provide a demagnification of about 100 to 500 times. In the embodiment of FIG. 2, a central part of a beamlet 23 first passes through beam stop array 8 (assuming it has not been deflected by beamlet blanker array 7). Then, the beamlet passes through a deflector or set of deflectors arranged in a sequence forming a deflection system, of beam deflection array 9, for scanning the beamlet across the surface of the target 11. The beamlet 23 subsequently passes through an electro-optical system of projection lens arrangement 10 and finally impinges on a target 11 in the target plane.

The projection lens arrangement 10 in the embodiment of the end module shown in FIG. 2, has three plates 12, 13 and 14 arranged in sequence, used to form an array of electrostatic lenses. The plates 12, 13, and 14 preferably comprise plates or substrates with apertures formed in them. The apertures are preferably formed as round holes though the plate, although other shapes can also be used. In an embodiment, the plates are formed of silicon or other semiconductor processed using process steps well-known in the semiconductor chip industry. The apertures can be conveniently formed in the plates using lithography and etching techniques known in the art.

The plates may be coated with an electrically conductive coating to form electrodes. A metal with a conductive native oxide may be used for the electrode, such as molybdenum, deposited onto the plate using techniques well known in the art. An electrical voltage is applied to each electrode to control the shape of the electrostatic lenses formed at the location of each aperture. Each electrode is controlled by a single control voltage for the complete array. Thus, in the embodiment shown in FIG. 2 with three electrodes, there will be only three voltages for all lenses.

The three control voltages V1, V2, and V3 create an array of uniform electrostatic lenses which focus and demagnify the large number of electron beamlets 23. The characteristics of the electrostatic lenses are controlled by the three control voltages, so that the amount of focusing and demagnification of all of the beamlets can be controlled by controlling these three voltages. In this way, a single common control signal can be used to control a whole array of electrostatic lenses for demagnifying and focusing a very large number of electron beamlets. A common control signal may be provided for each plate or as a voltage difference between two or more plates. The number of plates used in different projection lens arrangements may vary, and the number of common control signals may also vary.

The voltages V1, V2, and V3 may be set so that the difference in voltage between the second and third plates (13 and 14) is greater than the difference in voltage between first and second plates (12 and 13). This results in stronger lenses being formed between plates 13 and 14 so that the effective lens plane of each projection lens system is located between plates 13 and 14, as indicated in FIG. 2 by the curved hatched lines between plates 13 and 14 in the lens opening. This places the effective lens plane closer to the target and enables the projection lens systems to have a shorter focal length. It is further noted that while, for simplicity, the beamlet in FIG. 2 is shown focused as from the deflector 9, a more accurate representation of the focusing of beamlet 23, e.g. as in a traced ray illustration, would indicate that the actual lens plane of lens system 10 is between plates 13 and 14.

FIG. 2 also illustrates deflection of a beamlet 23 by deflection array 9 in the Y-direction, illustrated in FIG. 2 as a deflection of the beamlet from left to right. In the embodiment of FIG. 2, an aperture in deflection array 9 is shown for one or more beamlets to pass through, and electrodes are provided on opposite sides of the aperture, the electrodes provided with a voltage+V and−V. Providing a potential difference over the electrodes causes a deflection of the beamlet or beamlets passing though the aperture. Dynamically changing the voltages (or the sign of the voltages) will allow the beamlet(s) to be swept in a scanning fashion. Similarly, deflection may also be performed in a different direction perpendicular to the direction of propagation of the beamlets, e.g. in a direction into and out of the paper.

Figure 3:
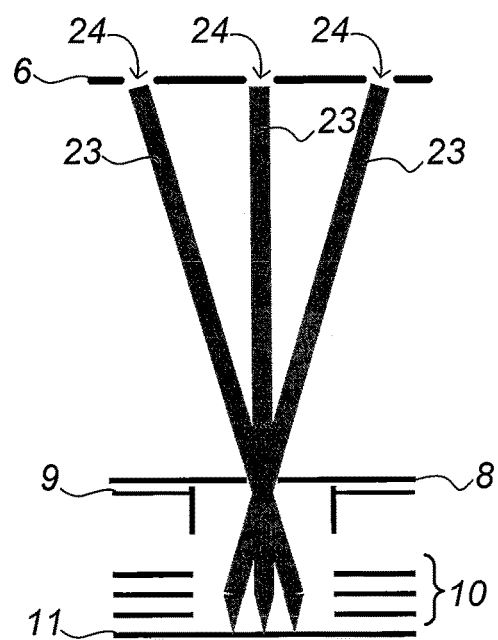
FIG. 3 is a conceptual diagrams illustrating the concept of multiple beamlets per projection lens.

FIG. 3 is a schematic diagram of the path of beamlets in the end module, to illustrate the aforementioned insight underlying using multiple beamlets per projection lens.

FIG. 3 shows a system having three beamlets per projection lens system, each beamlet originating from a separate point and passing though a projection lens system at different angles. The application of multiple beamlets through a single projection lens system appears to be possible without disturbing the amount of aberration. This is especially the case where all beamlets present in the lithography system are distributed over a multiplicity of projection lens systems.

The multiple aperture plate 6 above the deflector array 9 may comprise a multiplicity of apertures 24 as depicted, i.e. may have a patterned opening to accommodate the multiple beamlets 23 that correspond to a single lens system associated with on opening in beam stop array 8. Note that in a real design, the beam angle is much smaller than shown in FIG. 3. The relatively large beam angle shown in FIG. 3 is merely present to clarify the invention.

Because part or all of the plurality of beamlets directed through to a each projection lens system may be blanked at any point in time during operation, a system encompassing aforementioned principle may in this description be referred to as a patterned beamlet system. Such a patterned beamlet system may also be regarded as a multiplicity of miniaturized imaging systems arranged side by side.

Referring back to FIG. 1, a control unit 140 is configured to actuate movement of a substrate support member or (wafer) stage 16 arranged for supporting the target 11 to be exposed, e.g. a wafer. This movement is referred to variously in this description as a movement in a first direction or the Y-direction or the mechanical scan direction. The movement in the Y-direction is usually achieved by mechanical movement of the substrate support member, but could also be achieved by movement of the rest of the system, deflection of the beamlets, or any combination of the above techniques.

Further, the patterned beamlets are scanned across the surface of the target 11 by the deflector array 9. This movement of the beamlets is performed in a second direction, the second direction being different than the first direction. This second direction is referred to variously in this description as a second direction or X-direction or deflection scan direction. In one embodiment of the invention, the first direction is substantially perpendicular to the second direction, i.e. nearly perpendicular but not exactly perpendicular, as explained below. Please note that the movement of the beamlets in the second direction is generally a repetitive movement, i.e. a beamlet is scanned from a starting position over a certain distance until an end position and then moved back again to the starting position. Hence, the movement of the beamlets in the second direction may be performed with a certain predetermined frequency.

As mentioned previously, for lithography applications, the target usually comprises a wafer provided with a charged-particle sensitive layer or resist layer. The current industry standard is a 300 mm wafer, although new systems accommodating 450 mm wafers are already being designed. Wafers are typically divided into fixed size fields with a maximum dimension of 26 mm×33 mm, although other sized fields may also be used. Each field may be processed to produce multiple integrated circuits (i.e. the layout for multiple chips may be written into a single field) but the ICs usually do not cross a field border. With a maximum size of 26 mm×33 mm there are 63 fields available on a single standard 300 mm wafer. Smaller fields are possible and will result in a higher number of fields per wafer.

Figure 4:
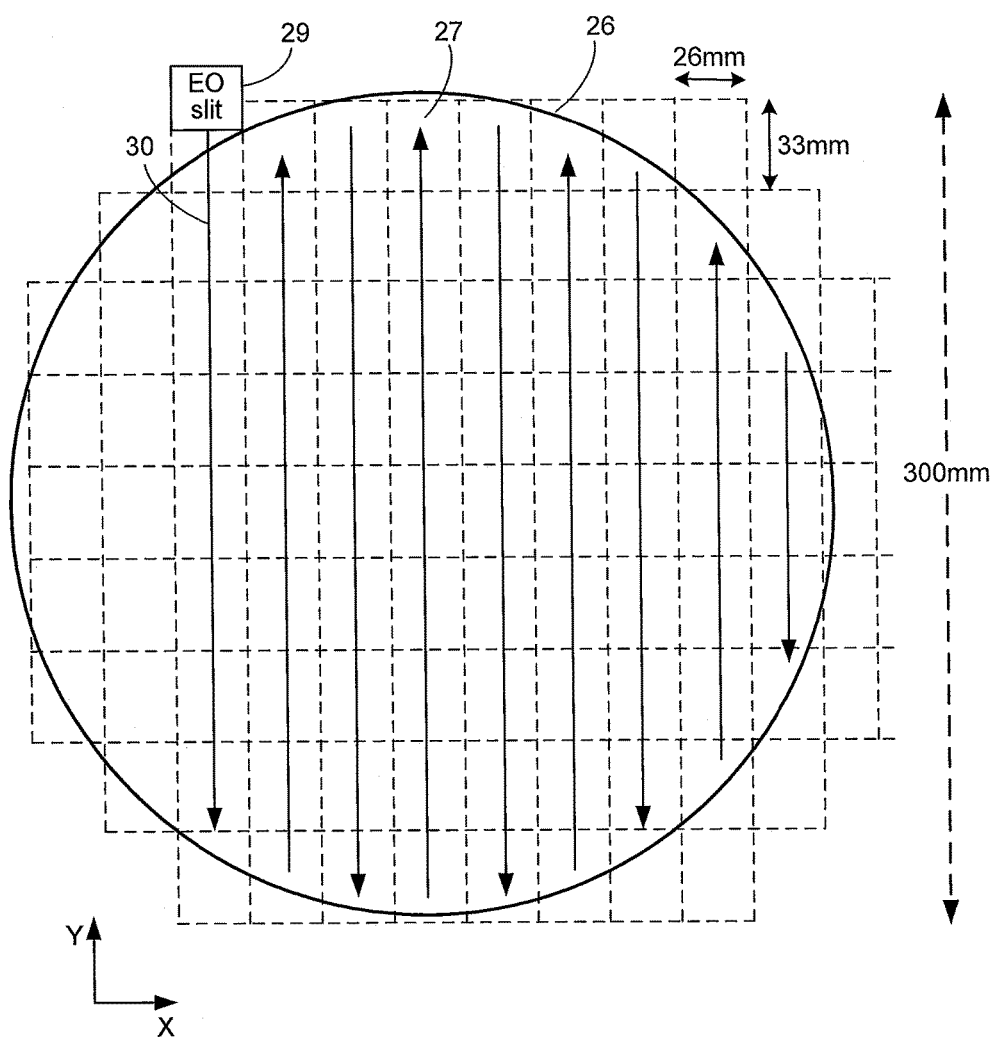
FIG. 4 is a diagram of an example of a wafer divided in to fields.

FIG. 4 shows a wafer 26 divided into a number of fields 27, and the direction of writing the fields 30. It is possible to write partial (incomplete) fields, for example by writing full fields into the partial fields and crossing the wafer boundary at the edges of the wafer. Note that FIG. 4 is not drawn exactly to scale.

In one embodiment of the lithography machine, the machine generates 13,260 sub-beams and each sub-beam is split into 49 beamlets arranged in a 7×7 unbalanced array, resulting in 649,740 beamlets (i.e. 13,260×49). Of the 13,260 sub-beams, 260 sub-beams may be used for a redundancy scan, i.e. for use during a second scan of each field to take the place of faulty beamlets. Other embodiments are also possible using a subset of sub-beams for a first scan and another (different) sub-set of sub-beams for a second scan of the same area of the wafer, in order to divide the total heat loading of the beamlets striking the wafer across two scans and to reduce the data path capacity needed for each scan by reducing the number of active sub-beams per scan. In a similar way, the sub-beams can be used in three or more subsets over three or more scans of the same area of the wafer.

When this arrangement is applied in the machine of FIG. 1, the aperture array 4 contains 13,260 holes and the aperture array 6 and beamlet blanker array 7 contain 649,740 holes, which form the electron-optical (EO) slit in an area of 26×26 mm (i.e. the size of the complete array of beamlets as projected onto the wafer). Each sub-beam comprising 49 beamlets may be used to write a single stripe in each field in the Y-direction.

Figure 5:
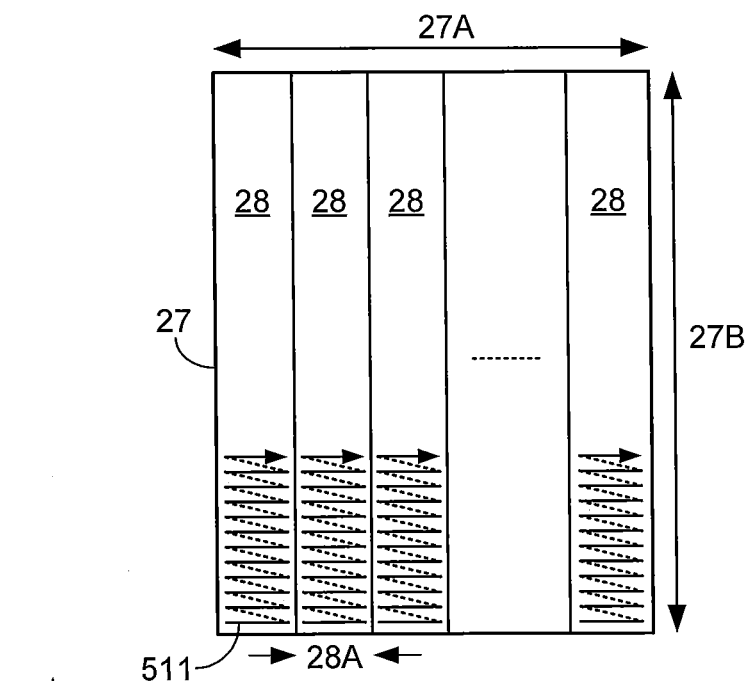
FIG. 5 is a diagram of an arrangement of sub-beam writing paths for writing a field of a wafer.

FIG. 5 illustrates an example of an arrangement of sub-beams for writing a field 27 of a wafer 26. In this arrangement, a single sub-beam 510 (e.g sub-beam 22 formed by sub-beam aperture array 4 of FIG. 1) is used for writing one stripe 28 of the field 27. In this embodiment, each sub-beam is scanned in an X-direction across the width of a stripe while the wafer 26 is moved in the Y-direction, resulting in each stripe 28 being exposed along a writing path 511 along the length 27B of the field 27. In this example, the sub-beams (e.g. 13,000 sub-beams out of a total 13,260 sub-beams) are arranged with writing paths 511 evenly distributed over the width 27A of the field (e.g. over 26 mm) in the X-direction resulting in stripes of width 28A (e.g. 2 µm) in the X-direction (substantially perpendicular to the Y-direction) and a stripe length as long as the field in the Y-direction (e.g. 33 mm in the example of FIG. 4).

Figure 6:
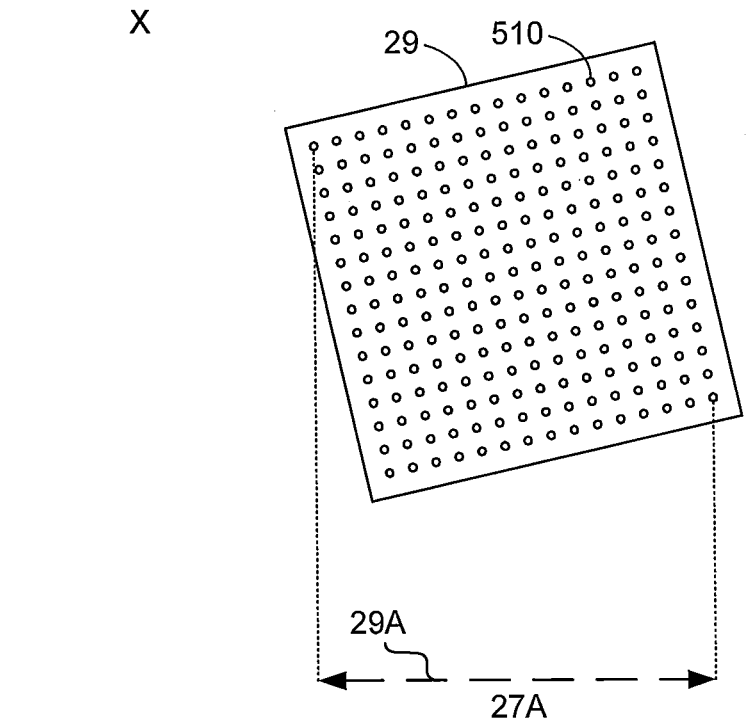
FIG. 6 is a diagram of an arrangement of sub-beams to form an electron-optical slit.

FIG. 6 shows an arrangement of sub-beams 510 to form an EO slit 29, arranged to form equally spaced writing paths which are distributed evenly across the width 27A of the field 27. As the wafer 26 is moved in the Y-direction, each sub-beam 510 of the array traces a writing path 511 along the length of a stripe 28 on the surface of the wafer. This results in the EO slit 29 having a writing width 29A, equal to the field width 27A (e.g. 26 mm). Note that FIG. 6 shows a square array of 225 sub-beams for convenience of illustration, although in a preferred embodiment a much larger number of sub-beams is used in a non-square arrangement, as will be described below. The arrangement of the sub-beams in the EO slit, and the arrangement of the multiple beamlets within each sub-beam, are important elements of the invention and are discussed in detail below.

The wafer is preferably written on (exposed) by the lithography machine in both a backward and forward Y-direction, as shown in FIG. 4. For convenience the drawings show the X- and Y-directions as being perpendicular. However, in some embodiments the two directions are substantially (but not exactly) perpendicular. In this embodiment, the X-direction is slightly tilted so that movement (scanning) of the sub-beams for writing in the X-direction is coordinated with the simultaneous relative movement of the target in the Y-direction, resulting in the end of an exposure scan line for a sub-beam being at approximately the same Y-direction position on the wafer as the beginning of the scan line for that sub-beam. The amount of tilt depends on the amount of movement in the Y-direction during the deflection scan of sub-beams in the X-direction, i.e. during exposure of a single scan line in the X-direction. Alternatively, the relative movement of the target in the Y-direction during the deflection scan may be taken into account by arranging the deflection scan of the sub-beam (e.g. by beam deflection array 9) to include a small component in the Y-direction. In this case, the X- and Y-directions may be (exactly) perpendicular to each other.

When the width of a field 27 is chosen to be smaller than the width 29A of the electron-optical (EO) slit 29 (i.e. the size of the complete array of sub-beams as projected onto the wafer) (e.g. smaller than the maximum size of 26 mm), then more fields can be placed on the wafer, but not all of the sub-beams will be used to write on the wafer. The EO slit will need to cross the wafer more often to write all fields and the overall throughput will decrease. Therefore, the EO slit 29 preferably has a writing width 29A that coincides with the width of a field 27.

The arrangement of sub-beams 510 in the EO slit 29 is determined by the pattern of apertures in the aperture array (e.g. aperture array 4 in the system of FIG. 1) that creates the sub-beams (although deflections and other manipulations of the sub-beams will also affect the arrangement of the sub-beams at the surface of the target 11). When designing an aperture array pattern, two relevant considerations are aperture density and mutual beam influence. Arranging the apertures in a regular hexagonal grid pattern (each aperture at an equal distance from six adjacent apertures) enables a high aperture density with relatively low and consistent mutual beam influence, due to every aperture being equidistant from all the neighbouring apertures. However, a regular hexagonal arrangement results in writing paths that are not uniformly spaced.

Figure 7:
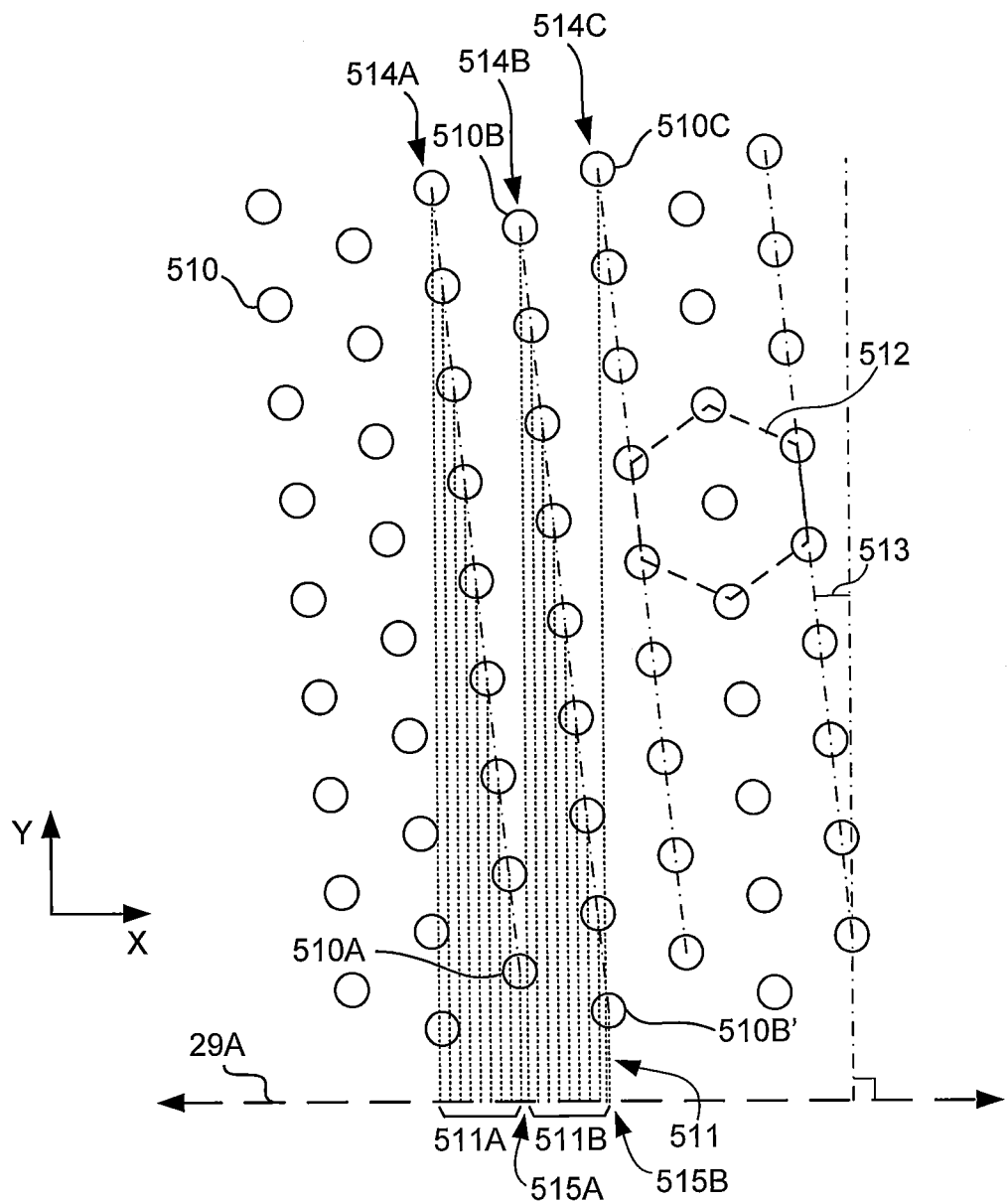
FIG. 7 is a diagram of a portion of a tilted hexagonal arrangement of sub-beams for an electron-optical slit.

FIG. 7 is a diagram of a portion of a hexagonal arrangement of apertures of an aperture array to form a corresponding arrangement of sub-beams 510 of an electron-optical slit 29. The sub-beams 510 and apertures are arranged in a regular hexagonal pattern (one regular hexagon indicated by reference number 512) with each aperture equi-distant from six neighbouring apertures, and the pattern is tilted by a shallow angle 513 with respect to the Y-direction. The resulting aperture pattern results in the sub-beams along one column forming parallel writing paths on a wafer when, for example, the wafer is moved in the Y-direction. For example, writing paths 511 formed by the sub-beams 510 positioned along columns 515A and 515B of the aperture array are shown in FIG. 7.

The aperture array may be tilted by an angle 513 selected so that the writing paths 511 of adjacent sub-beams in each column are separated by a desired distance, e.g. by the stripe width 28A. For example, all of the sub-beams 510 positioned along column 514A of the aperture array will have writing paths 511A separated by equal distances, and all of the sub-beams 510 along column 514B will have writing paths 511B separated by equal distances. The desired result is that all of the writing paths 511 of all of the sub-beams 501 are evenly distributed across the width 29A of the EO-slit 29, i.e. each writing path is equi-distant from adjacent writing paths.

However, due to the geometry of a regular hexagonal pattern, the distance separating adjacent writing paths of sub-beams on adjacent columns will not be uniform for all of the sub-beams. For example, in FIG. 7, the writing path of sub-beam 510A of column 514A and the writing path of sub-beam 510B of column 514B may be separated by a distance 515A different from the separation between the writing paths of the sub-beams of column 514A. The tilt angle 513 of the array could be adjusted to make the distance 515A the same as the writing path separation of the sub-beams of column 514A, but then the distance 515B between the writing path of sub-beam 510B' of column 514B and the writing path of sub-beam 510C of column 514C will be different from the writing path separation of the sub-beams of column 514A. Furthermore, for aperture arrangements having multiple beam areas separated by non-beam areas, e.g. as shown in the embodiment in FIGS. 8A-8C, the writing paths of sub-beams from adjacent beam areas may have a different separation distance than for sub-beams on the same column within a single beam area.

These uneven distances between adjacent writing paths results in a non-uniform distribution of sub-beams across the width 29A of the EO slit 29. This will result in uneven exposure of the wafer fields unless corrected, but correcting the uneven distribution of sub-beams will result in a more complex and difficult to control lithography system. Alternative arrangements of apertures are described below to overcome this problem.

Figure 8A:
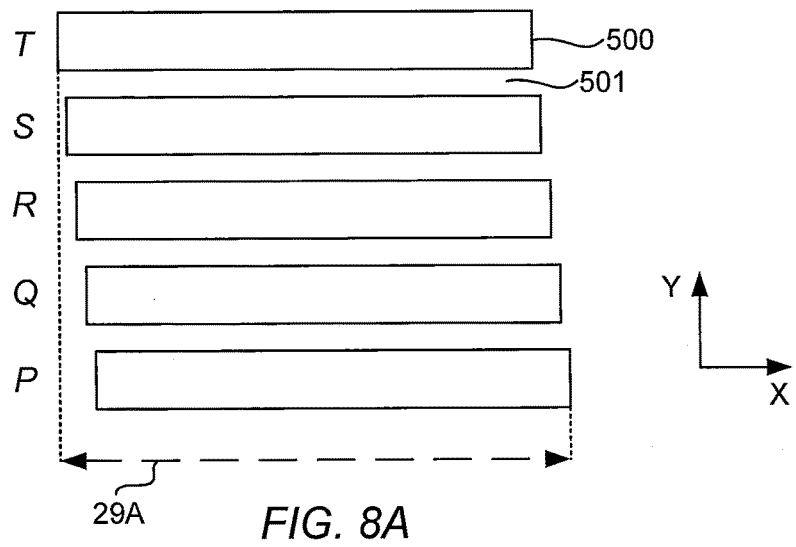
FIGS. 8A-C are diagrams showing the sub-beam aperture array at different levels of detail.
Figure 8B:
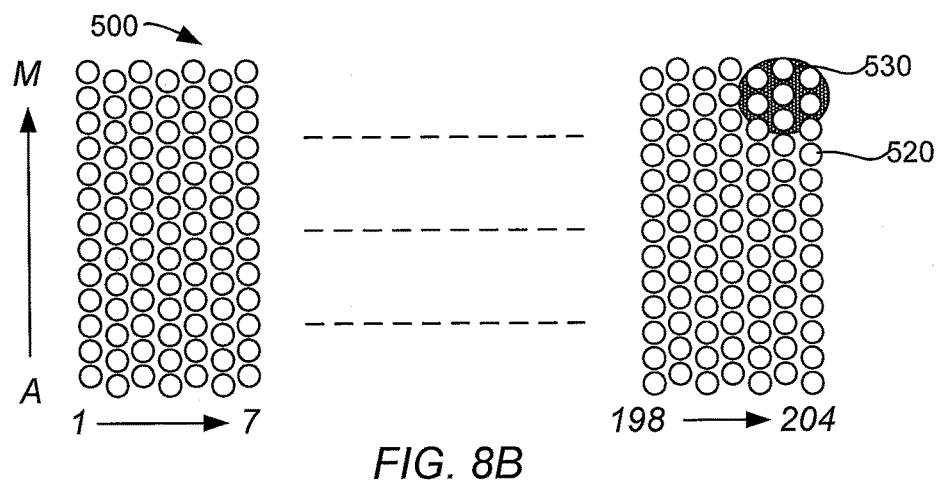
Figure 8C:
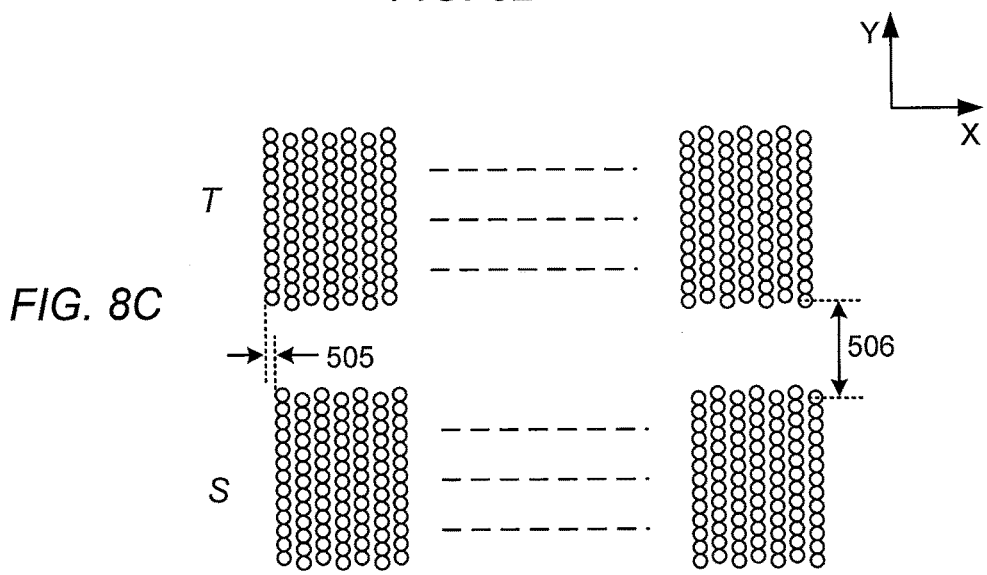

FIGS. 8A-C are diagrams showing an arrangement of apertures in the sub-beam aperture array at different levels of detail. FIG. 8A is a simplified diagram showing five beam areas 500 of an entire sub-beam aperture array 4. In this embodiment, the beam areas 500 are separated by non-beam areas 501 in which there are no apertures, so that the separate beam areas form distinct groups of apertures, each beam area 500 having a regular pattern of apertures which is interrupted by the non-beam areas 501. FIG. 8B is an enlarged diagram showing a single beam area 500. FIG. 8C is also an enlarged diagram showing the spatial relationships between two beam areas 500.

Beam areas may be designated by the letters P, Q, R, S, T. Although this embodiment includes five beam areas it may include fewer or more than five beam areas, and may comprise only a single beam area. In some embodiments, each beam area 500 includes an array of 204 columns by 13 rows of apertures, as shown in FIG. 8B with apertures 520 of beam area 500. Within each beam area, rows may be designated by the letters A through M, and each column may be designated by the numbers 1 through 204. Thus, each sub-beam aperture may be identified by beam area letter, row letter, and column number. For example, <T>-<M><1> is the top, left most sub-beam aperture of FIGS. 8A and 8C.

The apertures in all of the beam areas 500 are preferably distributed so that they are all spaced evenly when projected onto a line parallel with the X-direction, i.e. there is an equal distance between all adjacent apertures when projected onto this line. This arrangement results in forming sub-beams 510 (one sub-beam generated by each aperture 520) with equally spaced writing paths which are distributed evenly across the surface of a wafer when it is moved in the Y-direction (or more generally, when the wafer and sub-beams move relatively to each other). In one embodiment, the apertures 520 in the set of beams areas 500 are arranged to form an array of sub-beams 510, thus forming an EO slit 29 with equally spaced writing paths 511 which are distributed evenly across the width 27A of the field 27 of wafer 26. As the wafer 26 is moved in the Y-direction, each sub-beam 510 of the array traces a writing path 511 along the length of a stripe 28 on the surface of the wafer. This results in the EO slit 29 having a writing width 29A, equal to the field width 27A (e.g. 26 mm).

In some embodiments, the centerlines of row A apertures and row M apertures in the same numbered columns of neighboring beam areas have the same spacing 506, e.g. 4.225 mm, in the Y-direction, as shown in FIG. 8C. For example, the Y-direction distance between the T-A204 and S-M204 X-direction centerlines is 4.225 mm. Further, in some embodiments, neighboring beam area apertures that are in the same numbered column are offset by the same amount 505, e.g. 2 μm, with respect to direction Y'. For example, S-M1 may be offset by 2 μm from T-A1. Other offset values besides 4.225 mm and 2 μm are within the scope of the present invention. For example, the offset 505 of apertures within the same numbered column may be any fraction of the aperture diameter.

In some embodiments, the diameter of apertures 520 varies and in others it is constant. In some embodiments, the smallest diameter is approximately 2.7 μm. Equally-sized apertures and other diameter sizes are within the scope of the invention.

Figure 9A:
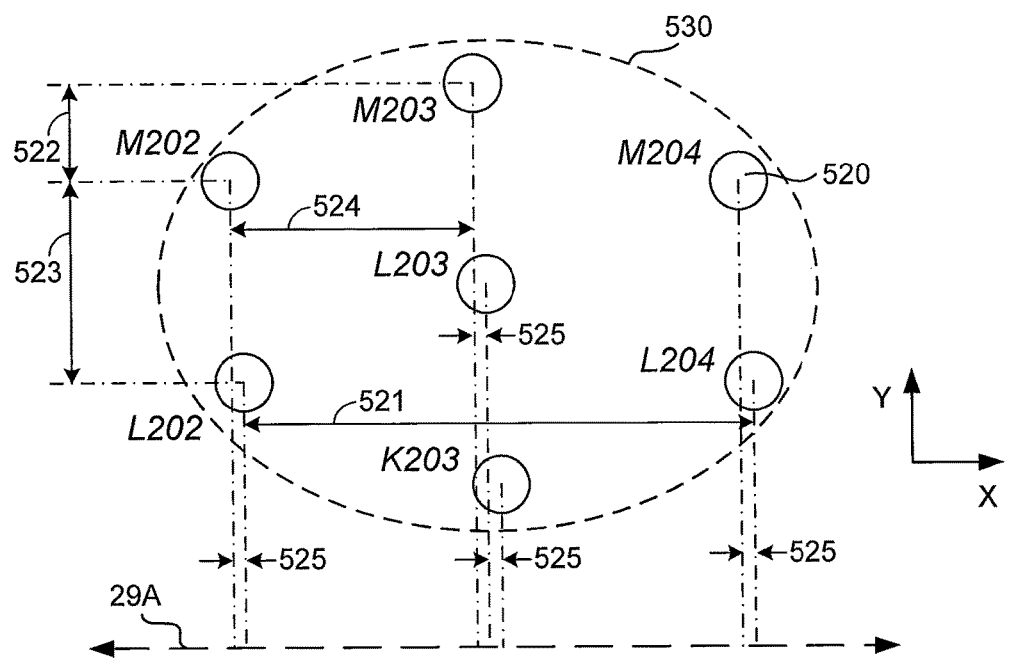
FIGS. 9A and 9B show the relationship between sub-beams and beamlets.

FIG. 9A is an enlarged view, with respect to FIG. 8B, of apertures 520, shown for illustrative purposes enclosed within circular or elliptic area 530 from one of the beams areas 500. The apertures 520 are arranged in a non-regular hexagonal pattern, and distributed so that the apertures are spaced evenly when projected onto a line 29A parallel with the X-direction. This arrangement results in forming sub-beams 510 (one sub-beam generated by each aperture 520) with equally spaced writing paths which are distributed evenly on the surface of a wafer when it is moved in the Y-direction (or more generally, when the wafer and sub-beams move relatively to each other). Only a small portion of the apertures of one beam area 500 are shown, but this arrangement is preferably reproduced across all of the apertures of each beam area.

In some embodiments, the apertures 520 are arranged in a plurality of columns oriented in the Y-direction, and adjacent columns are regularly spaced with a fixed pitch in the X-direction. The apertures 520 of every other column of the aperture array may be aligned in the X-direction and have a fixed pitch (e.g. distance 521 between apertures L202 and L204, equal to 260 μm in some embodiments). In some embodiments, apertures in adjacent columns of the aperture array are staggered by a fixed amount in the Y-direction (e.g. distance 522 between apertures M202 and M203, equal to 75 μm in some embodiments) and have a uniform aperture column pitch (e.g. pitch 523 between apertures M202 and L202, equal to 150 μm in some embodiments). Thus, in the embodiment shown in FIG. 9A, aperture L203 is located at the X-direction midpoint (e.g. 130 μm) between apertures L202 and L204 and the Y-direction midpoint (e.g. 75 μm) between apertures M202 and L202.

Further still, in some embodiments, neighboring apertures within the same numbered column of a beam area are offset in the X-direction by a uniform amount (e.g. offset 525, equal to 2 μm in some embodiments). That is, in the embodiment shown in FIG. 9A, apertures K203 and L203 are offset by 2 μm and apertures K203 and M203 are offset by 4 μm in the X-direction. Other pitch and offset values are within the scope of the present invention. In some embodiments, the uniform offset 525 in the X-direction between neighboring apertures within the same column of a beam area 500 is the same as the offset 505 between neighbouring apertures of different beam areas on either side of a non-beam area. For example, in the embodiment shown in FIG. 8C, aperture S-M1 may be offset from aperture T-A1 in the X-direction by the same amount as the offset between aperture T-A1 and T-B1 in the X-direction (e.g. offset by 2 μm).

As can be seen in FIG. 9A, the aperture pattern is a hexagonal pattern; however, the pattern is not a regular hexagon but has an offset or skew between apertures in each column. Rather, as explained above, apertures are staggered in the Y-direction and, in this embodiment, align in the X-direction in every other column. Although a regular hexagonal grid pattern has desirable properties, as explained above it involves significant tradeoffs.

One aspect of the invention is based on the insight that a skewed or offset hexagonal pattern e.g. as described above obtains most of the benefits of a regular hexagonal pattern regarding aperture density and mutual beam influence, but maintains uniform spacing of writing paths and avoids or minimizes other disadvantages of a tilted regular hexagonal pattern.

Figure 9B:
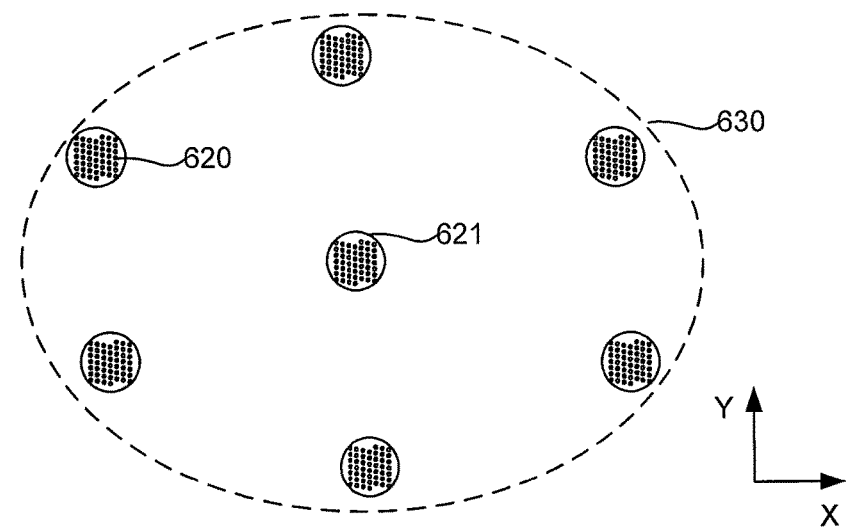

FIG. 9B is a diagram showing a portion of the multiple aperture array 6. Circle/ellipse 620 encompasses an area of the aperture array 6 where a group of sub-beams 510 generated by the apertures 520 shown in FIG. 9A are projected onto the multiple aperture array 6. Each sub-beam 510 is projected onto a beam spot 621 which includes a group of beamlet apertures 620 residing on the multiple aperture array 6. In some embodiments, the beam spots 621 formed by sub-beams 510 maintain similar spacing as the sub-beam apertures 520.

Figure 10A:
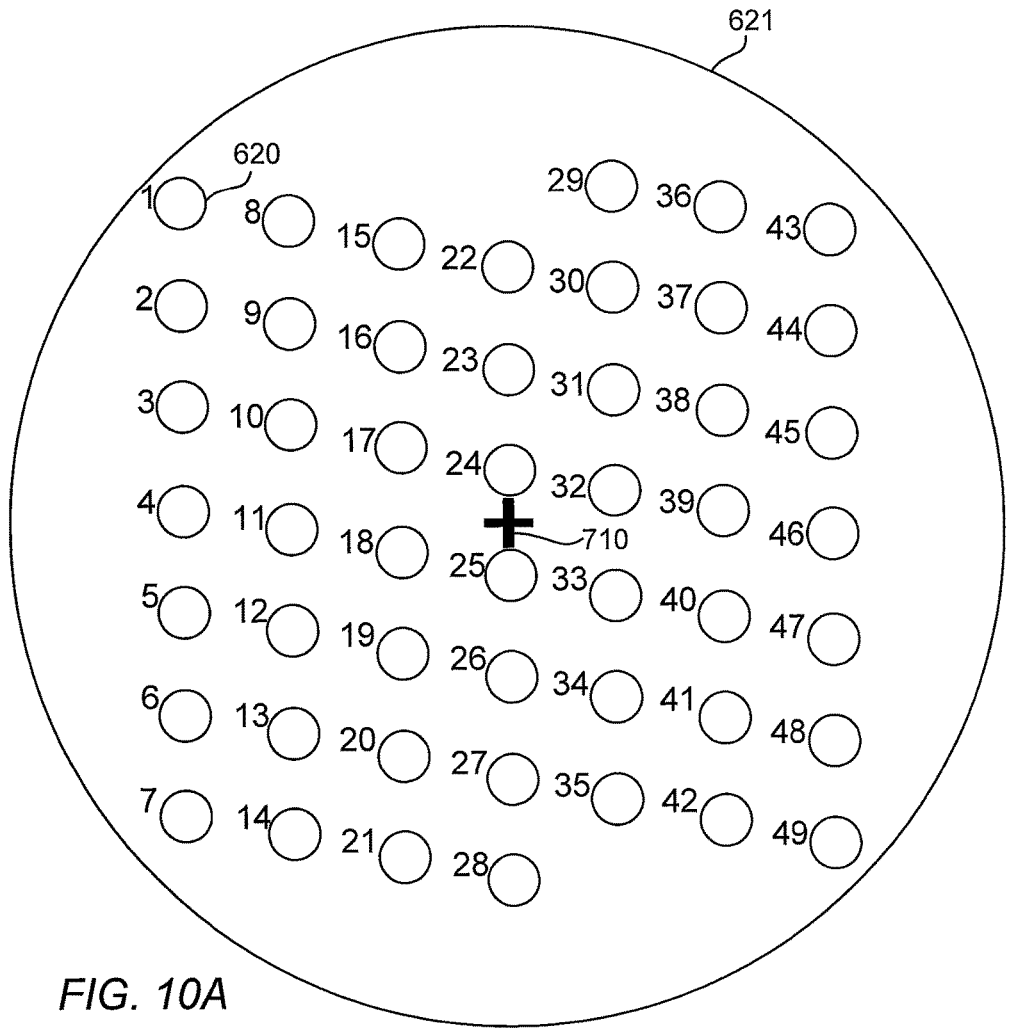
FIGS. 10A and 10B are diagrams showing a beamlet aperture group.

FIG. 10A is an enlarged diagram, relative to FIG. 9B, showing one group of beamlet apertures 620 which are formed from one sub-beam 510. Each group of beamlet apertures 620 forms a beam spot 621. Cross 710 shows the center point of beam spot 621. In some embodiments, beamlet apertures 620 are numbered 1 through 49. Thus, each beamlet aperture 620 may be identified by its aperture number and the corresponding beam area letter, row letter, and column number, as discussed above. In some embodiments, beamlet apertures may have a diameter of approximately 2.7 μm.

In the embodiment shown in FIG. 10A, the beamlet apertures 620 are arranged in a square array, with apertures arranged in rows and columns with an equal number of apertures in the rows and columns. Other arrangements may also be used, but it is preferred to arrange the apertures 620 compactly within the circular beam spot 621. One aspect of the embodiment shown is arranging apertures in an unbalanced array pattern. As can be seen in FIG. 10A, not every row of the array contains the same number of apertures. Thus, it is an example of an unbalanced array. The unbalanced array may also be characterized as having one or more "shifted" columns, wherein the patterning scheme shifts one or more columns in relation to the other columns of the array. For example, in FIG. 10A the three columns on the right side have been shifted upwards by one row with respect to the four columns on the left side. The apertures 620 may be aligned in columns that follow the Y-direction (as shown in FIG. 10A), or the X-direction, or another direction.

Figure 10B:
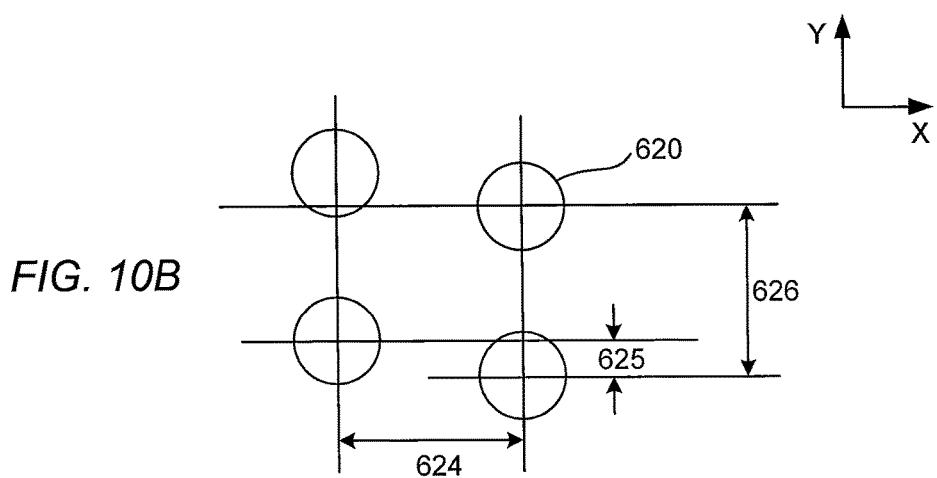

A further aspect of the invention includes offsetting apertures within a column of apertures to skew the array and provide slanting rows (at an angle with respect to the X-direction in FIG. 10A, e.g. the row made by apertures 1, 8, 15, 22, 30, 37, 44). In particular, an intra-row offset 625 between neighbouring apertures 620 in the Y-direction may be equal to a fraction of the pitch 624 between neighboring apertures within a row in the X-direction, as shown in FIG. 10B. FIG. 10B is an enlarged diagram, relative to FIG. 10A, showing a sub-group of four neighboring beamlet apertures 620.

In some embodiments, the intra-row offset 625 is equal to the pitch 624 between beamlet apertures 620 of neighboring columns divided by the number of apertures within the row. This results in all of the apertures 620 within a group/beam spot 621 being equally spaced when projected onto a line parallel to the Y-direction. This arrangement results in forming beamlets (e.g. one beamlet 610 generated by each aperture 620) with equally spaced writing paths 611 which are distributed evenly on the surface of a wafer when the group of beamlets 621 is moved in the X-direction (e.g. by the deflection scan of the beamlets). For example, the beamlet apertures 620 in FIG. 10A mostly form slanted rows of seven apertures. Thus, the offset 625 between apertures neighboring within a row is approximately 1.143 μm with a row pitch 624 of 8 μm, i.e., 8 μm/7 apertures per row≈1.143 μm.

Another aspect of the arrangement includes patterning an array such that the group of beamlet apertures 620 are offset from center point 710 of beam spot 621. In embodiments including forty-nine apertures that are arranged within each beam spot, each aperture may be associated with an aperture number, and the offset of each aperture from the center of the beam spot may be defined by the following formulas:

$$app_{xoffset}=(int[(num-1)/7)]-3)*pitch;$$

$$app_{yoffset}=(-pitch/2)+[(6-[(num-1)\bmod 7]+int(num/29)-3)*pitch]-[(pitch/7)*(int[(num-1)/7)]-3)];$$

where $app_{xoffset}$ and $app_{yoffset}$ express the X and Y-axis offset from center point 710, num=aperture number, and int[ ] is a floor function that maps a real number to the largest previous integer, including 0.

FIGS. 10A and 10B illustrate only one embodiment. Alternative arrangements of unbalanced arrays, number of apertures, row and column pitches, and intra-row offset values are within the scope of the invention.

Figure 11A:
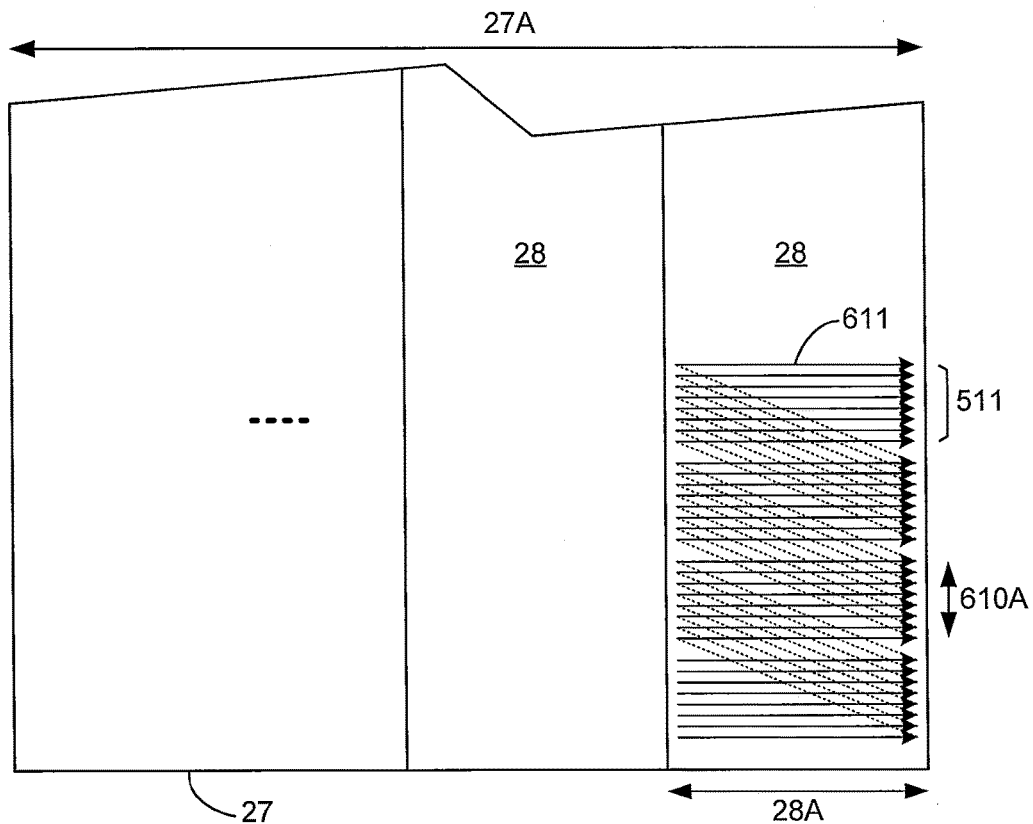
FIG. 11A is a diagram of an arrangement of beamlet writing paths for writing stripes of a field of a wafer.

FIG. 11A is a diagram showing beamlet writing paths 611 for writing stripes 28 of a field 27 of a wafer. In this embodiment, multiple groups 621 of beamlets 610 are generated, each group of beamlets assigned to writing one stripe 28 of the field 27. In one embodiment, each beamlet group 621 is formed from a single sub-beam 510, and the sub-beams are arranged with writing paths 511 as shown in FIG. 5. Thus, in this arrangement, multiple sub-beams 510 are arranged with writing paths 511 evenly spaced and distributed in one direction (e.g. in the X-direction across the width of the field 27), and multiple beamlets 610 formed from each one of the sub-beams 510 are arranged with writing paths 611 evenly spaced and distributed in a different direction (e.g. in the Y-direction along the length of the field 27). The two directions are preferably exactly or nearly perpendicular to each other.

It should be noted that this arrangement may be used without actually forming any sub-beams. The groups of beamlets 610 may be formed in a single aperture array, in which the groups form beam spots 621 which are evenly spaced and distributed in one direction (e.g. in the X-direction across the width of the field 27). The multiple beamlets 610 in each group/beam spot 621 are arranged with writing paths 611 evenly spaced and distributed in a different direction (e.g. in the Y-direction along the length of the field 27), where the two directions are preferably exactly or nearly perpendicular to each other.

Figure 11B:
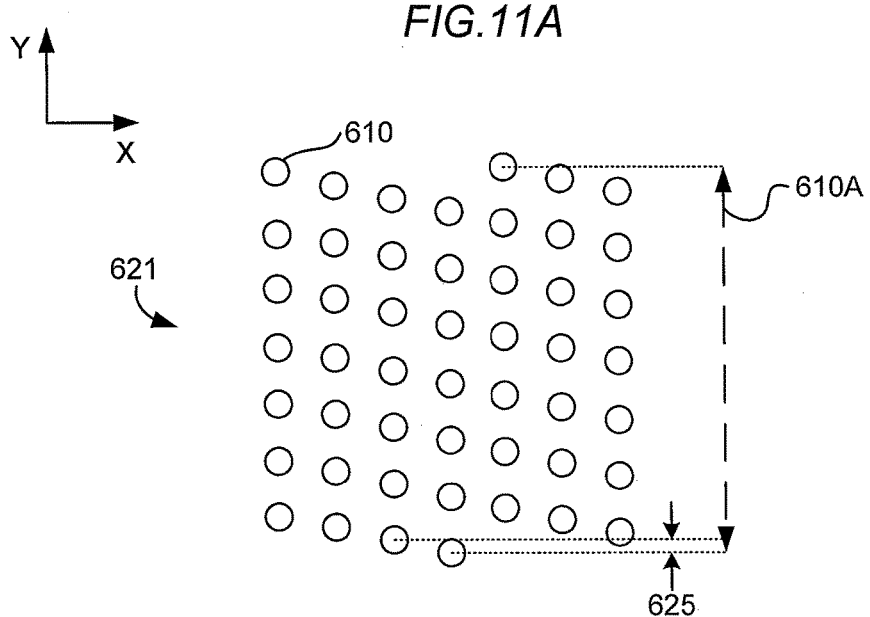
FIG. 11B is a diagram of an arrangement of beamlets for writing a stripe of a field.

FIG. 11B is a diagram of an arrangement of beamlets 610 which may be generated by the aperture arrangement shown in FIG. 10A suitable for the writing scheme shown in FIG. 11A. The beamlets 610 are arranged to form writing paths 611 with uniform spacing 625 when the group of beamlets is scanned in the X-direction across the wafer. The writing paths 611 are evenly distributed across a beam spot width 610A in the Y-direction.

Figure 12A:
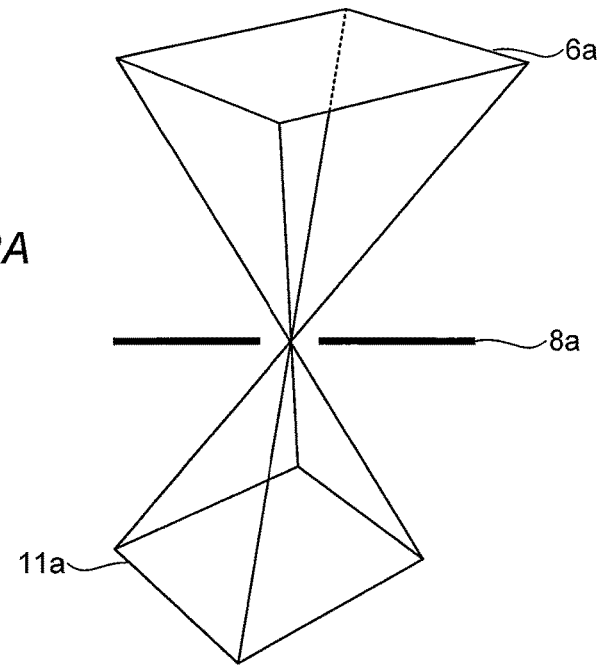
FIGS. 12A and 12B are diagrams showing a beamlet aperture group and the beamlets projected on a wafer substrate.

FIG. 12A is a simplified schematic diagram showing a beamlet crossover at the beam stop array 8. In particular, FIG. 12A shows a portion 6a of the multiple aperture array 6, a portion 8a of the beam stop array 8, and a portion 11a of the wafer. In each case, the portions 6a, 8a, and 11a correspond to a beamlet group, as shown in FIG. 10A.

To explain further, a beamlet group is projected from the multiple aperture array potion 6a and towards beam stop array portion 8a. The beamlet group crosses over at or near beam stop array portion. This crossover results in a translated image being projected on wafer portion 11a.

Figure 12B:
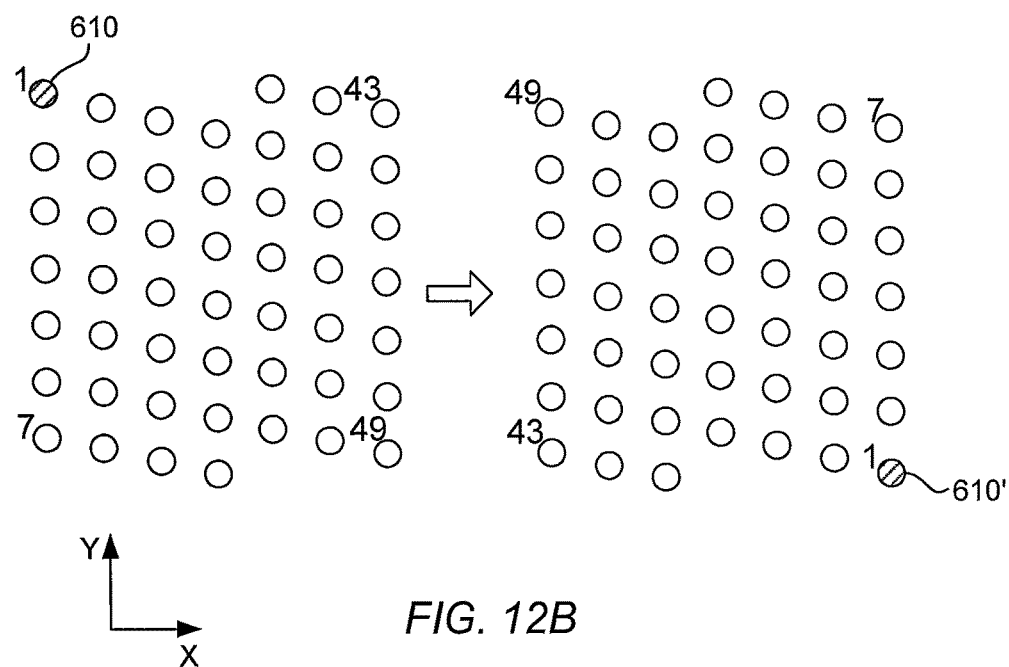

FIG. 12B shows in more detail the beamlet group translation. On the left, a group of beamlets 610 are shown, as exiting multiple aperture array portion 6a. The beamlets 610 are numbered in the same fashion as in FIG. 10A, but only the numbers 1, 7, 43, and 49 are shown for clarity. Further beamlet number 1 is shaded to clearly show the translation.

On the right, a group of beamlets 610' are shown, as projected on wafer portion 11a. The two groups of beamlets 610 and 610' show, for example, that beamlet numbers 1, 7, 43, and 49 are translated into a different position, along with the other beamlets not numbered in FIG. 12B.

Figure 13A:
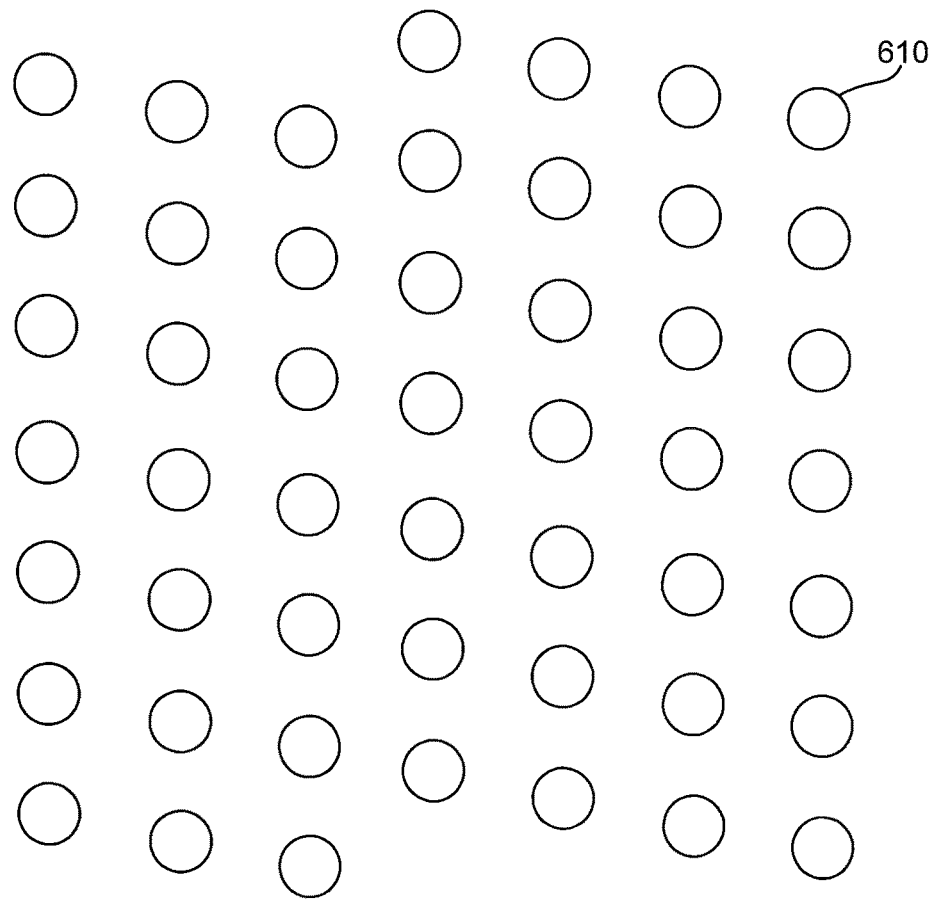
FIGS. 13A and 13B are diagrams showing the beamlets projected on a wafer substrate.
Figure 13A:
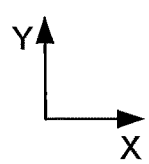
Figure 13B:
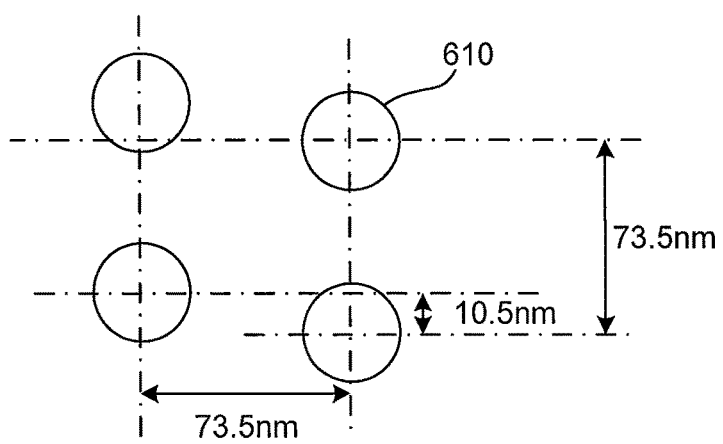

FIG. 13A is an enlarged diagram, relative to FIG. 12B, showing the group of beamlets 610', as projected on a wafer. FIG. 13B is a further enlarged diagram, showing a sub-group of four neighboring beamlets 610'. Because of focusing and demagnification, the column and row pitch may be much smaller in relation to the column and row pitch of the multiple aperture array portion shown in FIG. 10A. For example, in some embodiments the offset between beamlets neighboring within a row is 10.5 nm with a row and column pitch of 73.5 nm.

Figure 14:
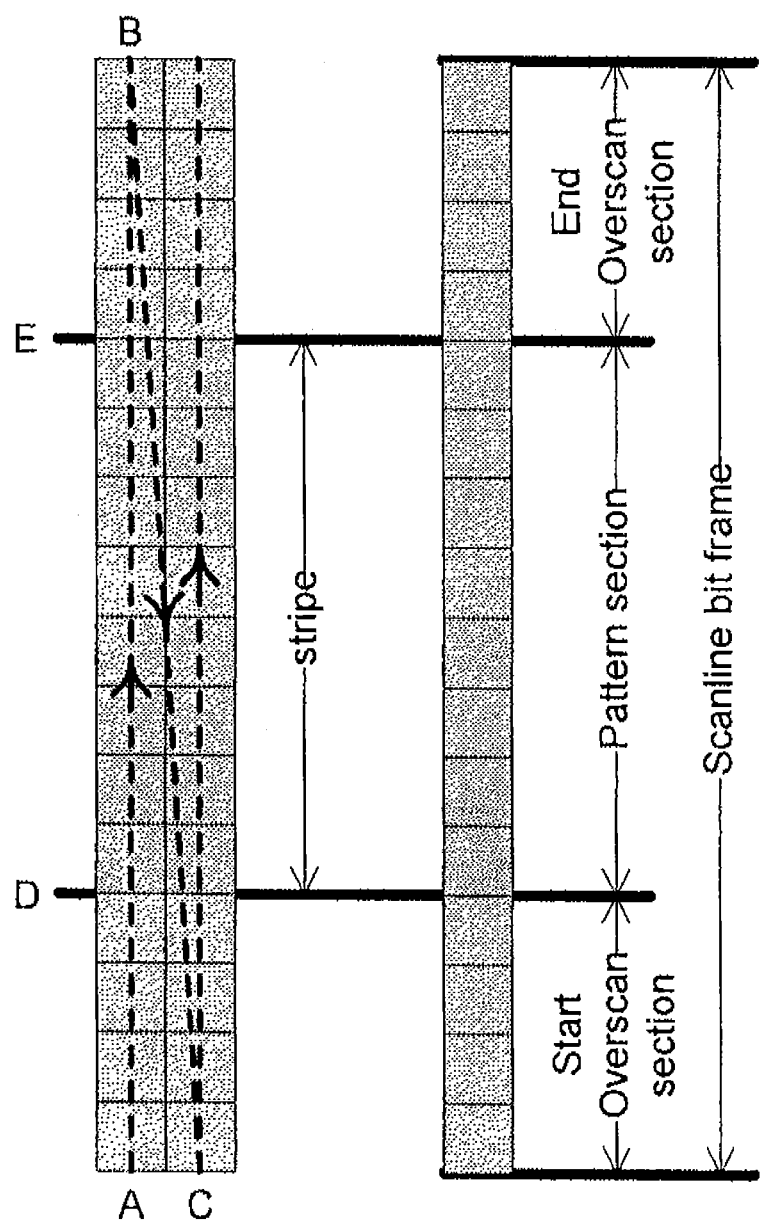
FIG. 14 is a schematic diagram showing a beamlet scan line.

As further exampled below, one advantage of the present invention is minimizing overscan. FIG. 14 shows a schematic diagram of a scan line of a beam or beamlet, including the sub-beam or beamlet's overscan section. A beam deflector array (e.g., beam deflector array 9 of FIG. 1) generates a deflection signal, which includes a scan phase (from A to B) and a fly-back phase (from B to C). During the scan phase, the deflection signal moves a group of beamlets (corresponding to a sub-beam), each beam having its own scan line and scan area. After the scan phase, the fly-back phase starts, in which the beamlets are switched off and the deflection signal quickly moves the beamlets back to the position where the next scan phase will start.

A scan line is the path of a sub-beam or beamlet on the surface of the wafer during the scan phase. A scan line (see FIG. 14 at the right) is divided into three sections: a start overscan section, a pattern section, and an end overscan section. In the overscan sections, the beamlets are typically switched off. In the pattern section, the beamlets are switched on according to the features required to be written in the wafer field. The bits in the scan-line bit frame for both the overscan section and pattern section represent data to be transferred to the beam blanker array. The bits/pixels in the overscan section consume bandwidth of the data path and increase wafer processing time.

It is therefore desirable to arrange the apertures of the aperture plate to minimize overscanning. Embodiments of the present invention minimize this problem, as can be seen in FIGS. 15A and 15B.

Figure 15A:
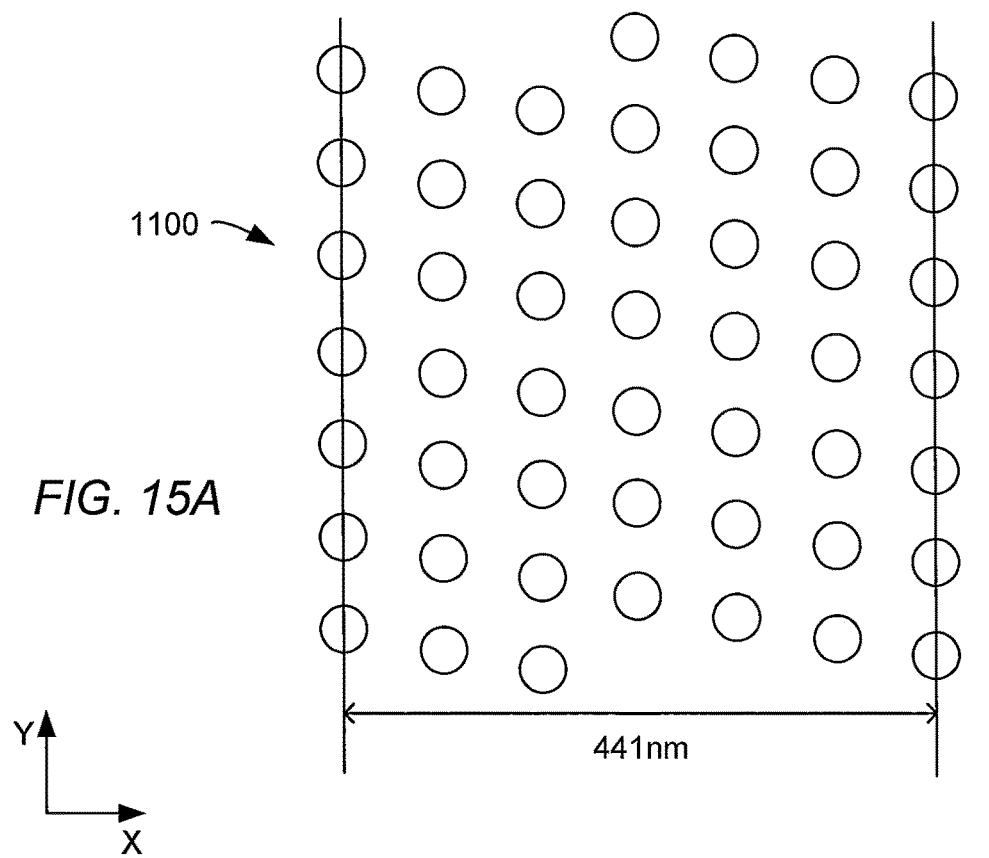
FIGS. 15A and 15B show the difference in overscan between two aperture patterning schemes.
Figure 15B:
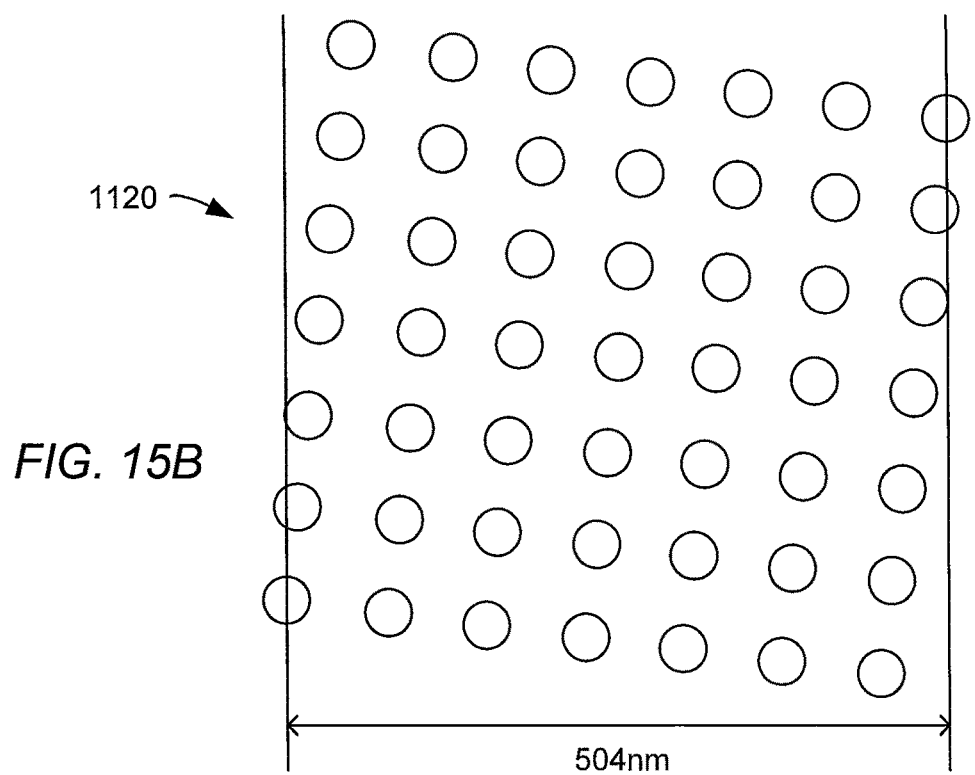

FIGS. 15A and 15B are diagrams showing two groups of beamlets and their respective overscan length. Beamlet group 1100 is projected by an multiple aperture array in an embodiment of the present invention. Beamlet group 1120 is projected by an alternative multiple aperture array having a rotated balanced array. Both beamlet groups 1100 and 1120 are shown as projected on a section of a wafer. Both beamlet groups have the same number of beamlets and are projected by multiple aperture arrays that have the same fill factor and a column and row pitch of 8 µm.

As explained in FIG. 14, a scanline bit frame includes two overscan sections, a start overscan section and end overscan section. For some writing schemes, the bit length of these sections are in proportion to the X-axis width of a beamlet group. Beamlet group 1120 is 63 nm wider than beamlet group 1100. The overscan per scan line for beamlet group 1120 is 1.104 µm compared to 1.041 µm for beamlet group 1100. Further, the throughput performance of beamlet group 1100 is at least 2% higher than beamlet group 1120.

Although the figures show a particular lithography system, sub-beam array 4 and multiple aperture array 6 are beneficial in a number of different configurations upstream and downstream of the arrays, including the use of either array 4 or 6 individually and with other arrays not within the scope of the invention. Arrays 4 and 6 may be implemented in either parallel or perpendicular writing strategies. Further, the beamlets may be focused individually or in groups.

Thus, it will be recognized that these embodiments are susceptible to various modifications and alternative forms well known to those of skill in the art without departing from the spirit and scope of the invention. Accordingly, although specific embodiments have been described, these are examples only and are not limiting upon the scope of the invention, which is defined in the accompanying claims.

The invention claimed is:

1. A sub-beam aperture array for forming a plurality of sub-beams from one or more charged particle beams, the sub-beam aperture array comprising one or more beam areas, each beam area comprising a plurality of sub-beam apertures arranged in a non-regular hexagonal pattern, the sub-beam apertures arranged so that, when projected in a first direction onto a line parallel to a second direction, the sub-beam apertures are uniformly spaced along the line, and wherein the first direction is different from the second direction.

2. The sub-beam aperture array of claim 1, wherein, within each of the one or more beam areas, the sub-beam apertures are arranged in a plurality of columns regularly spaced in the second direction, and the sub-beam apertures in each column are offset by a same amount, in the second direction, from each adjacent sub-beam aperture in the same column.

3. The sub-beam aperture array of claim 2, wherein the offset between sub-beam apertures within each column is the same as an offset between a sub-beam aperture in one beam area and an adjacent sub-beam aperture in a corresponding column of another beam area.

4. The sub-beam aperture array of claim 3, wherein the offset of adjacent sub-beam apertures in a single column is equal to a fraction of a diameter of the sub-beam apertures.

5. The sub-beam aperture array of claim 1, wherein, within each of the one or more beam areas, the sub-beam apertures in each column are staggered, in the first direction, with respect to the sub-beam apertures of a neighboring column.

6. The sub-beam aperture array of claim 1, wherein the sub-beam apertures of every other column are aligned in the second direction.

7. The sub-beam aperture array of claim 1, wherein the second direction is substantially perpendicular to the first direction.

8. A charged particle lithography system for exposing a target using a plurality of charged particle sub-beams, the system comprising:
a charged particle generator for generating a charged particle beam;
a sub-beam aperture array for forming a plurality of sub-beams from one or more charged particle beams, the sub-beam aperture array comprising one or more beam areas, each beam area comprising a plurality of sub-beam apertures arranged in a non-regular hexagonal pattern, the sub-beam apertures arranged so that, when projected in a first direction onto a line parallel to a second direction, the sub-beam apertures are uniformly spaced along the line, and wherein the first direction is different from the second direction;
a projection lens system configured to project the sub-beams onto a surface of the target;
wherein the system further comprises a beamlet aperture array comprising a plurality of beamlet apertures arranged in one or more groups, the beamlet aperture array arranged to receive the sub-beams and form a plurality of beamlets at the locations of the beamlet apertures of the beamlet array.

9. The system of claim 8, wherein each group of beamlet apertures corresponds with a separate charged particle sub-beam projected onto the beamlet aperture array.

10. The system of claim 8, wherein the beamlet apertures are arranged so that, when projected in a fourth direction onto a line parallel to a third direction, the sub-beam apertures of each group are uniformly spaced along the line, and wherein the third direction is different from the fourth direction.

11. The system of claim 10, wherein the first direction is the same as the third direction, and the second direction is the same as the fourth direction.

12. The system of claim 10, wherein the beamlet apertures are arranged in rows and columns, and each beamlet aperture within a row of the beamlet aperture array is uniformly offset in the third direction from adjacent beamlet apertures in the row.

13. The system of claim 10, wherein the beamlet apertures within a column of each group align in the fourth direction.

14. The system of claim 8, wherein the beamlet apertures are arranged in a plurality of groups, each group corresponding to a sub-beam, wherein the positions of the beamlet apertures within each group form an unbalanced array.

15. The system of claim 14, wherein beamlet apertures neighboring within a row of the beamlet aperture array are offset from each other by a uniform amount with respect to the third direction.

16. The system of claim 15, wherein the offset is equal to a fraction of the pitch between the neighboring beamlet apertures.

17. The system of claim 16, wherein the fraction is equal to the pitch between the neighboring beamlet apertures divided by the number of beamlet apertures within the row.

18. The system of claim 8, wherein the beamlet apertures in each group form a skewed square array.

19. The system of claim 8, wherein the beamlet apertures in each group are all offset from the center of a beam spot formed by the group of beamlet apertures.

20. The system of claim 19, wherein forty-nine beamlet apertures are arranged within the beam spot, each beamlet aperture is associated with an aperture number, and the offset in an X direction of each beamlet aperture from the center of the beam spot is defined by the formula: appxoffset=(int[(aperture number−1)/7)]−3) * pitch, where int is a floor function.

21. The system of claim 19, wherein the offset in a Y direction of each beamlet aperture from the center of the beam spot is defined by the formula: appyoffset =(−pitch/2)+[(6−[(aperture number−1) mod 7]+int(aperture number/29)−3)*pitch]−[(pitch/7)*(int[(aperture number−1)/7)]−3)], where int is a floor function.

22. The system of claim 8, further comprising a deflector arranged to deflect the sub-beams in the first direction and a moveable stage for moving the target in the second direction.

23. A beamlet aperture array for forming a plurality of beamlets from charged particle sub-beams, the beamlet aperture array comprising a plurality of beamlet apertures arranged in a plurality of groups, each group corresponding to a sub-beam, wherein the positions of the beamlet apertures within each group form an unbalanced array.

24. The beamlet aperture array of claim 23, wherein beamlet apertures neighboring within a row of the beamlet aperture array are offset from each other by a uniform amount with respect to a third direction.

25. The beamlet aperture array of claim 24, wherein the offset is equal to a fraction of the pitch between the neighboring beamlet apertures.

26. The beamlet aperture array of claim 25, wherein the fraction is equal to the pitch between the neighboring beamlet apertures divided by the number of beamlet apertures within the row.

27. The beamlet aperture array of claim 23, wherein the beamlet apertures in each group form a skewed square array.

28. The beamlet aperture array of claim 23, wherein the beamlet apertures in each group are all offset from the center of a beam spot formed by the group of beamlet apertures.

29. The beamlet aperture array of claim 28, wherein forty-nine beamlet apertures are arranged within the beam spot, each beamlet aperture is associated with an aperture number, and the offset in an X direction of each beamlet aperture from the center of the beam spot is defined by the formula: appxoffset=(int[(aperture number−1)/7)]−3)*pitch, where int is a floor function.

30. The beamlet aperture array of claim 28, wherein the offset in a Y direction of each beamlet aperture from the center of the beam spot is defined by the formula: appyoffset=(−pitch/2)+[(6−[(aperture number−1) mod 7]+int(aperture number/29)−3)*pitch]−[(pitch/7)*(int[(aperture number−1)/7)]−3)], where int is a floor function.

31. The beamlet aperture array of claim 23, wherein the groups are arranged in a non-regular hexagonal array.

32. The beamlet aperture array of claim 23, further comprising one or more beam areas, each beam area comprising a plurality of groups of beamlet apertures, wherein in each beam area the groups are arranged in a non-regular hexagonal array.

33. A method for exposing a field of a target using a plurality of charged particle beamlets, the field having a length in a first direction and a width in a second direction, the method comprising:

forming the charged particle beamlets into a plurality of discrete groups arranged in a non-regular hexagonal pattern, the groups being equally spaced across the width of the field; and moving the target in the first direction and simultaneously scanning each group of beamlets across a width of a corresponding stripe of the field so that each beamlet follows a writing path on a surface of the target; wherein the writing paths of the beamlets of each group are evenly spaced in the first direction.

* * * * *